United States Patent
Maharyta

(10) Patent No.: US 9,423,427 B2
(45) Date of Patent: *Aug. 23, 2016

(54) METHODS AND CIRCUITS FOR MEASURING MUTUAL AND SELF CAPACITANCE

(71) Applicant: Parade Technologies, Ltd., Santa Clara, CA (US)

(72) Inventor: Andriy Maharyta, Lviv (UA)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 228 days.

This patent is subject to a terminal disclaimer.

(21) Appl. No.: 14/203,145

(22) Filed: Mar. 10, 2014

(65) Prior Publication Data

US 2014/0266257 A1  Sep. 18, 2014

Related U.S. Application Data

(63) Continuation of application No. 13/720,861, filed on Dec. 19, 2012, now Pat. No. 8,692,563, which is a continuation of application No. 12/395,462, filed on Feb. 27, 2009, now Pat. No. 8,358,142.

(60) Provisional application No. 61/067,539, filed on Feb. 27, 2008.

(51) Int. Cl.
G01R 27/26 (2006.01)
G06F 3/041 (2006.01)
(Continued)

(52) U.S. Cl.
CPC ................. *G01R 17/00* (2013.01); *G01D 5/24* (2013.01); *G01R 27/2605* (2013.01);
(Continued)

(58) Field of Classification Search
CPC ...... G01D 5/24; G01D 5/241; G01D 5/2412; G01D 5/2417; G06F 3/016; G06F 3/0414; G06F 2203/04103; G06K 9/0002; G01L 1/146; G01R 15/16; G01R 19/2513; G01R 27/26; G01R 27/2605; G01R 31/028; H03K 17/955; H03K 2217/960725
USPC .......... 324/519, 600, 649, 658, 686; 702/47, 702/52; 340/545.4, 562; 73/335.04, 304 C, 73/514.32, 718, 724, 780, 862.337, 73/862.62, 6; 345/173, 174

See application file for complete search history.

(56) References Cited

U.S. PATENT DOCUMENTS 3,660,801 A  5/1972  Paulfus
3,921,167 A  11/1975 Fox
(Continued)

FOREIGN PATENT DOCUMENTS

EP  0574213 A  12/1993
GB  05000604   2/2005
(Continued)

OTHER PUBLICATIONS

SIPO Office Action for Application No. 201080042141.X dated Aug. 2, 2014; 6 pages.
(Continued)

*Primary Examiner* — Hoai-An D Nguyen
(74) *Attorney, Agent, or Firm* — Morgan, Lewis & Bockius LLP

(57) ABSTRACT

In an example embodiment, an apparatus includes a sensing device. The sensing device includes circuitry configured to sense self-capacitance and circuitry configured to sense mutual-capacitance, each configured to detect capacitance values corresponding to whether an object is proximate to a touch screen. The sensing device is configured to measure a first capacitance value using the self-capacitance circuitry during self-capacitance sensing operations and to measure a second capacitance value using the mutual-capacitance circuitry during mutual-capacitance sensing operations.

16 Claims, 17 Drawing Sheets

(51) Int. Cl.
   *G01R 17/00* (2006.01)
   *G01D 5/24* (2006.01)
   *H03K 17/96* (2006.01)
   *G06F 3/01* (2006.01)
   *G01D 5/241* (2006.01)
   *G06K 9/00* (2006.01)

(52) U.S. Cl.
   CPC ........... *H03K 17/962* (2013.01); *G01D 5/241* (2013.01); *G01D 5/2412* (2013.01); *G01D 5/2417* (2013.01); *G06F 3/016* (2013.01); *G06F 3/0414* (2013.01); *G06K 9/0002* (2013.01)

(56) References Cited

U.S. PATENT DOCUMENTS

| | | |
|---|---|---|
| 3,979,745 A | 9/1976 | Bishop |
| 4,039,940 A | 8/1977 | Butler et al. |
| 4,090,092 A | 5/1978 | Serrano |
| 4,103,252 A | 7/1978 | Bobick |
| 4,113,378 A | 9/1978 | Wirtz |
| 4,145,748 A | 3/1979 | Eichelberger et al. |
| 4,193,063 A | 3/1980 | Hitt et al. |
| 4,238,711 A | 12/1980 | Wallot |
| 4,264,903 A | 4/1981 | Bigelow |
| 4,266,144 A | 5/1981 | Bristol |
| 4,283,713 A | 8/1981 | Philipp |
| 4,292,604 A | 9/1981 | Embree et al. |
| 4,293,734 A | 10/1981 | Pepper |
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,558,274 A | 12/1985 | Carusillo |
| 4,560,830 A | 12/1985 | Perl |
| 4,586,260 A | 5/1986 | Baxter et al. |
| 4,614,937 A | 9/1986 | Poujois |
| 4,686,332 A | 8/1987 | Greanias et al. |
| 4,728,932 A | 3/1988 | Atherton |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,505 A | 11/1989 | Barrow et al. |
| 4,879,508 A | 11/1989 | Andermo |
| 4,908,574 A | 3/1990 | Rhoades et al. |
| 4,920,399 A | 4/1990 | Hall |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,089,757 A | 2/1992 | Wilson |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,755 A | 6/1992 | Nootbaar et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,323,158 A | 6/1994 | Ferguson |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,365,461 A | 11/1994 | Stein et al. |
| 5,373,245 A | 12/1994 | Vranish |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,412,387 A | 5/1995 | Vincelette et al. |
| 5,424,756 A | 6/1995 | Ho et al. |
| 5,461,321 A | 10/1995 | Sanders et al. |
| 5,479,103 A | 12/1995 | Kernahan et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | LeMoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,589,856 A | 12/1996 | Stein et al. |
| 5,629,891 A | 5/1997 | LeMoncheck et al. |
| 5,642,134 A | 6/1997 | Ikeda |
| 5,648,642 A | 7/1997 | Miller et al. |
| 5,650,597 A | 7/1997 | Redmayne |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,694,063 A | 12/1997 | Burlison et al. |
| 5,730,165 A | 3/1998 | Philipp |
| 5,748,185 A | 5/1998 | Stephan et al. |
| 5,757,368 A | 5/1998 | Gerpheide et al. |
| 5,760,852 A | 6/1998 | Wu et al. |
| 5,763,909 A | 6/1998 | Mead et al. |
| 5,763,924 A | 6/1998 | Lum et al. |
| 5,767,457 A | 6/1998 | Gerpheide et al. |
| 5,790,107 A | 8/1998 | Kasser et al. |
| 5,796,183 A | 8/1998 | Hourmand |
| 5,801,340 A | 9/1998 | Peter |
| 5,812,698 A | 9/1998 | Platt et al. |
| 5,825,352 A | 10/1998 | Bisset et al. |
| 5,841,078 A | 11/1998 | Miller et al. |
| 5,844,256 A | 12/1998 | Higashino |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |

(56) References Cited

U.S. PATENT DOCUMENTS

| | | | |
|---|---|---|---|
| 5,864,242 | A | 1/1999 | Allen et al. |
| 5,864,392 | A | 1/1999 | Winklhofer et al. |
| 5,880,411 | A | 3/1999 | Gillespie et al. |
| 5,889,236 | A | 3/1999 | Gillespie et al. |
| 5,905,489 | A | 5/1999 | Takahama et al. |
| 5,914,465 | A | 6/1999 | Allen et al. |
| 5,914,708 | A | 6/1999 | LaGrange et al. |
| 5,920,309 | A | 7/1999 | Bisset et al. |
| 5,920,310 | A | 7/1999 | Faggin et al. |
| 5,926,566 | A | 7/1999 | Wang et al. |
| 5,942,733 | A | 8/1999 | Allen et al. |
| 5,943,052 | A | 8/1999 | Allen et al. |
| 5,949,264 | A | 9/1999 | Lo |
| 5,969,513 | A | 10/1999 | Clark |
| 6,023,422 | A | 2/2000 | Allen et al. |
| 6,028,271 | A | 2/2000 | Gillespie et al. |
| 6,028,959 | A | 2/2000 | Wang et al. |
| 6,037,929 | A | 3/2000 | Ogura et al. |
| 6,037,930 | A | 3/2000 | Wolfe et al. |
| 6,060,957 | A | 5/2000 | Kodmja et al. |
| 6,067,019 | A | 5/2000 | Scott |
| 6,097,432 | A | 8/2000 | Mead et al. |
| 6,140,853 | A | 10/2000 | Lo |
| 6,145,850 | A | 11/2000 | Rehm |
| 6,148,104 | A | 11/2000 | Wang et al. |
| 6,184,871 | B1 | 2/2001 | Teres et al. |
| 6,185,450 | B1 | 2/2001 | Seguine et al. |
| 6,188,228 | B1 | 2/2001 | Philipp |
| 6,188,391 | B1 | 2/2001 | Seely et al. |
| 6,191,723 | B1 | 2/2001 | Lewis |
| 6,222,528 | B1 | 4/2001 | Gerpheide et al. |
| 6,239,389 | B1 | 5/2001 | Allen et al. |
| 6,249,447 | B1 | 6/2001 | Boylan et al. |
| 6,262,717 | B1 | 7/2001 | Donohue et al. |
| 6,271,719 | B1 | 8/2001 | Sevastopoulos |
| 6,271,720 | B1 | 8/2001 | Sevastopoulos |
| 6,271,835 | B1 | 8/2001 | Hoeksma |
| 6,278,283 | B1 | 8/2001 | Tsugai |
| 6,280,391 | B1 | 8/2001 | Olson et al. |
| 6,288,707 | B1 | 9/2001 | Philipp |
| 6,295,052 | B1 | 9/2001 | Kato et al. |
| 6,304,014 | B1 | 10/2001 | England et al. |
| 6,320,184 | B1 | 11/2001 | Winklhofer et al. |
| 6,323,846 | B1 | 11/2001 | Westerman et al. |
| 6,326,859 | B1 | 12/2001 | Goldman et al. |
| 6,342,817 | B1 | 1/2002 | Crofts et al. |
| 6,344,773 | B1 | 2/2002 | Sevastopoulos et al. |
| 6,353,200 | B1 | 3/2002 | Schwankhart |
| 6,366,099 | B1 | 4/2002 | Reddi |
| 6,377,009 | B1 | 4/2002 | Philipp |
| 6,377,129 | B1 | 4/2002 | Rhee et al. |
| 6,380,929 | B1 | 4/2002 | Platt |
| 6,380,931 | B1 | 4/2002 | Gillespie et al. |
| 6,400,217 | B1 | 6/2002 | Bhandari |
| 6,414,671 | B1 | 7/2002 | Gillespie et al. |
| 6,424,338 | B1 | 7/2002 | Anderson |
| 6,430,305 | B1 | 8/2002 | Decker |
| 6,441,073 | B1 | 8/2002 | Tanaka et al. |
| 6,441,682 | B1 | 8/2002 | Vinn et al. |
| 6,445,257 | B1 | 9/2002 | Cox et al. |
| 6,448,911 | B1 | 9/2002 | Somayajula |
| 6,449,195 | B1 | 9/2002 | Min et al. |
| 6,452,514 | B1 | 9/2002 | Philipp |
| 6,457,355 | B1 | 10/2002 | Philipp |
| 6,459,321 | B1 | 10/2002 | Belch |
| 6,459,424 | B1 | 10/2002 | Resman |
| 6,466,036 | B1 | 10/2002 | Philipp |
| 6,473,069 | B1 | 10/2002 | Gerpheide |
| 6,476,798 | B1 | 11/2002 | Bertram et al. |
| 6,489,899 | B1 | 12/2002 | Ely et al. |
| 6,490,203 | B1 | 12/2002 | Tang |
| 6,498,720 | B2 | 12/2002 | Glad |
| 6,499,359 | B1 | 12/2002 | Washeleski et al. |
| 6,522,083 | B1 | 2/2003 | Roach |
| 6,522,128 | B1 | 2/2003 | Ely et al. |
| 6,522,187 | B1 | 2/2003 | Sousa |
| 6,523,416 | B2 | 2/2003 | Takagi et al. |
| 6,529,015 | B2 | 3/2003 | Nonoyama et al. |
| 6,534,970 | B1 | 3/2003 | Ely et al. |
| 6,535,200 | B2 | 3/2003 | Philipp |
| 6,570,557 | B1 | 5/2003 | Westerman et al. |
| 6,574,095 | B2 | 6/2003 | Suzuki |
| 6,577,140 | B1 | 6/2003 | Wenman |
| 6,583,632 | B2 | 6/2003 | Von Basse et al. |
| 6,587,093 | B1 | 7/2003 | Shaw et al. |
| 6,597,347 | B1 | 7/2003 | Yasutake |
| 6,610,936 | B2 | 8/2003 | Gillespie et al. |
| 6,614,313 | B2 | 9/2003 | Crofts et al. |
| 6,624,640 | B2 | 9/2003 | Lund et al. |
| 6,639,586 | B2 | 10/2003 | Gerpheide |
| 6,642,857 | B1 | 11/2003 | Schediwy et al. |
| 6,649,924 | B1 | 11/2003 | Philipp et al. |
| 6,667,740 | B2 | 12/2003 | Ely et al. |
| 6,673,308 | B2 | 1/2004 | Hino et al. |
| 6,677,758 | B2 | 1/2004 | Maki et al. |
| 6,677,932 | B1 | 1/2004 | Westerman |
| 6,680,731 | B2 | 1/2004 | Gerpheide et al. |
| 6,683,462 | B2 | 1/2004 | Shimizu |
| 6,690,066 | B1 | 2/2004 | Lin et al. |
| 6,700,392 | B2 | 3/2004 | Haase |
| 6,704,005 | B2 | 3/2004 | Kato et al. |
| 6,705,511 | B1 | 3/2004 | Dames et al. |
| 6,714,817 | B2 | 3/2004 | Daynes et al. |
| 6,720,777 | B2 | 4/2004 | Wang |
| 6,730,863 | B2 | 5/2004 | Gerpheide et al. |
| 6,731,121 | B1 | 5/2004 | Hsu et al. |
| 6,744,258 | B2 | 6/2004 | Ishio et al. |
| 6,750,852 | B2 | 6/2004 | Gillespie et al. |
| 6,753,801 | B2 | 6/2004 | Rossi |
| 6,768,420 | B2 | 7/2004 | McCarthy et al. |
| 6,774,644 | B2 | 8/2004 | Eberlein |
| 6,781,577 | B2 | 8/2004 | Shigetaka |
| 6,788,221 | B1 | 9/2004 | Ely et al. |
| 6,788,521 | B2 | 9/2004 | Nishi |
| 6,798,218 | B2 | 9/2004 | Kasperkovitz |
| 6,803,905 | B1 | 10/2004 | Capps et al. |
| 6,806,693 | B1 | 10/2004 | Bron |
| 6,809,275 | B1 | 10/2004 | Cheng et al. |
| 6,810,442 | B1 | 10/2004 | Lin et al. |
| 6,825,673 | B1 | 11/2004 | Yamaoka |
| 6,825,890 | B2 | 11/2004 | Matsufusa |
| 6,829,727 | B1 | 12/2004 | Pawloski |
| 6,838,887 | B2 | 1/2005 | Denen et al. |
| 6,839,052 | B1 | 1/2005 | Kramer |
| 6,856,433 | B2 | 2/2005 | Hatano et al. |
| 6,859,159 | B2 | 2/2005 | Michalski |
| 6,861,961 | B2 | 3/2005 | Sandbach et al. |
| 6,873,203 | B1 | 3/2005 | Latham, II et al. |
| 6,879,215 | B1 | 4/2005 | Roach |
| 6,879,930 | B2 | 4/2005 | Sinclair et al. |
| 6,882,338 | B2 | 4/2005 | Flowers |
| 6,888,536 | B2 | 5/2005 | Westerman et al. |
| 6,888,538 | B2 | 5/2005 | Ely et al. |
| 6,891,531 | B2 | 5/2005 | Lin |
| 6,893,724 | B2 | 5/2005 | Lin et al. |
| 6,897,673 | B2 | 5/2005 | Savage et al. |
| 6,903,402 | B2 | 6/2005 | Miyazawa |
| 6,904,570 | B2 | 6/2005 | Foote et al. |
| 6,914,547 | B1 | 7/2005 | Swaroop et al. |
| 6,933,873 | B1 | 8/2005 | Horsley et al. |
| 6,940,291 | B1 | 9/2005 | Ozick |
| 6,946,853 | B2 | 9/2005 | Gifford et al. |
| 6,949,811 | B2 | 9/2005 | Miyazawa |
| 6,949,937 | B2 | 9/2005 | Knoedgen |
| 6,958,594 | B2 | 10/2005 | Redl et al. |
| 6,969,978 | B2 | 11/2005 | Dening |
| 6,970,120 | B1 | 11/2005 | Bjornsen |
| 6,970,126 | B1 | 11/2005 | McCartney |
| 6,975,123 | B1 | 12/2005 | Malang et al. |
| 6,993,607 | B2 | 1/2006 | Philipp |
| 6,999,009 | B2 | 2/2006 | Monney |
| 7,002,557 | B2 | 2/2006 | Iizuka et al. |
| 7,006,078 | B2 | 2/2006 | Kim |
| 7,006,938 | B2 | 2/2006 | Laraia et al. |

(56) References Cited

U.S. PATENT DOCUMENTS

| | | |
|---|---|---|
| 7,030,782 B2 | 4/2006 | Ely et al. |
| 7,030,860 B1 | 4/2006 | Hsu et al. |
| 7,031,886 B1 | 4/2006 | Hargreaves |
| 7,032,051 B2 | 4/2006 | Reay et al. |
| 7,036,096 B1 | 4/2006 | Sarkar et al. |
| 7,046,230 B2 | 5/2006 | Zadesky et al. |
| 7,050,927 B2 | 5/2006 | Sinclair et al. |
| 7,068,039 B2 | 6/2006 | Parker |
| 7,075,316 B2 | 7/2006 | Umeda et al. |
| 7,075,864 B2 | 7/2006 | Kakitsuka et al. |
| 7,078,916 B2 | 7/2006 | Denison |
| 7,084,645 B1 | 8/2006 | Umeda et al. |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,129,714 B2 | 10/2006 | Baxter |
| 7,129,935 B2 | 10/2006 | Mackey |
| 7,133,140 B2 | 11/2006 | Lukacs et al. |
| 7,133,793 B2 | 11/2006 | Ely et al. |
| 7,136,051 B2 | 11/2006 | Hein et al. |
| 7,141,968 B2 | 11/2006 | Hibbs et al. |
| 7,141,987 B2 | 11/2006 | Hibbs et al. |
| 7,148,704 B2 | 12/2006 | Philipp |
| 7,151,276 B2 | 12/2006 | Gerlach et al. |
| 7,151,528 B2 | 12/2006 | Taylor et al. |
| 7,158,056 B2 | 1/2007 | Wright et al. |
| 7,158,125 B2 | 1/2007 | Sinclair et al. |
| 7,202,655 B2 | 4/2007 | Itoh |
| 7,202,857 B2 | 4/2007 | Hinckley et al. |
| 7,205,777 B2 | 4/2007 | Schulz et al. |
| 7,212,189 B2 | 5/2007 | Shaw et al |
| 7,224,591 B2 | 5/2007 | Kaishita et al. |
| 7,225,090 B2 | 5/2007 | Coley |
| 7,233,508 B2 | 6/2007 | Itoh |
| 7,235,983 B2 | 6/2007 | McCartney et al. |
| 7,245,131 B2 | 7/2007 | Kurachi et al. |
| 7,253,643 B1 | 8/2007 | Seguine |
| 7,254,775 B2 | 8/2007 | Geaghan et al. |
| 7,256,588 B2 | 8/2007 | Howard et al. |
| 7,262,609 B2 | 8/2007 | Reynolds |
| 7,271,608 B1 | 9/2007 | Vermeire et al. |
| 7,288,946 B2 | 10/2007 | Hargreaves et al. |
| 7,288,977 B2 | 10/2007 | Stanley |
| 7,298,124 B2 | 11/2007 | Kan et al. |
| 7,301,350 B2 | 11/2007 | Hargreaves et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,323,886 B2 | 1/2008 | Lee |
| 7,333,090 B2 | 2/2008 | Tanaka et al. |
| 7,339,580 B2 | 3/2008 | Westerman et al. |
| 7,359,816 B2 | 4/2008 | Kumar et al. |
| 7,375,535 B1 | 5/2008 | Kutz et al. |
| 7,378,810 B1 | 5/2008 | Sutardja et al. |
| 7,381,031 B2 | 6/2008 | Kawaguchi et al. |
| 7,392,431 B2 | 6/2008 | Swoboda |
| 7,406,393 B2 | 7/2008 | Ely et al. |
| 7,417,411 B2 | 8/2008 | Hoffman et al. |
| 7,417,441 B2 | 8/2008 | Reynolds |
| 7,423,437 B2 | 9/2008 | Hargreaves et al. |
| 7,439,962 B2 | 10/2008 | Reynolds et al. |
| 7,449,895 B2 | 11/2008 | Ely et al. |
| 7,450,113 B2 | 11/2008 | Gillespie et al. |
| 7,451,050 B2 | 11/2008 | Hargreaves |
| 7,453,270 B2 | 11/2008 | Hargreaves et al. |
| 7,453,279 B2 | 11/2008 | Corbin et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,515,140 B2 | 4/2009 | Philipp |
| 7,521,941 B2 | 4/2009 | Ely et al. |
| RE40,867 E | 8/2009 | Binstead |
| 7,598,752 B2 | 10/2009 | Li |
| 7,598,822 B2 | 10/2009 | Rajagopal et al. |
| 7,656,168 B2 | 2/2010 | Mahowald et al. |
| 7,663,607 B2 | 2/2010 | Hotelling et al. |
| 7,667,468 B1 | 2/2010 | Anderson |
| 7,683,641 B2 | 3/2010 | Hargreaves et al. |
| 7,804,307 B1 | 9/2010 | Bokma et al. |
| 7,812,827 B2 | 10/2010 | Hotelling et al. |
| 7,812,829 B2 | 10/2010 | Gillespie et al. |
| 7,821,274 B2 * | 10/2010 | Philipp .................. G06F 3/044 324/658 |
| 7,831,070 B1 | 11/2010 | Cheng et al. |
| 7,855,718 B2 | 12/2010 | Westerman |
| 7,868,874 B2 | 1/2011 | Reynolds |
| 7,880,481 B2 * | 2/2011 | Zangl ....................... G01D 5/24 324/684 |
| 7,911,456 B2 | 3/2011 | Gillespie et al. |
| 7,932,897 B2 | 4/2011 | Elias et al. |
| 7,952,366 B2 * | 5/2011 | Philipp .................. G06F 1/3203 324/663 |
| 7,969,166 B2 * | 6/2011 | Fasshauer ............ H03K 17/955 324/662 |
| 8,040,142 B1 | 10/2011 | Bokma et al. |
| 8,040,321 B2 | 10/2011 | Peng et al. |
| 8,049,732 B2 | 11/2011 | Hotelling et al. |
| 8,054,299 B2 | 11/2011 | Krah |
| 8,059,015 B2 | 11/2011 | Hua et al. |
| 8,067,948 B2 * | 11/2011 | Sequine ............. G01R 31/2829 324/678 |
| 8,068,097 B2 | 11/2011 | GuangHai |
| 8,072,429 B2 | 12/2011 | Grivna |
| 8,082,566 B2 | 12/2011 | Stallings |
| 8,089,288 B1 | 1/2012 | Maharita |
| 8,089,289 B1 | 1/2012 | Kremin et al. |
| 8,093,914 B2 | 1/2012 | Maharyta et al. |
| 8,094,128 B2 | 1/2012 | Vu et al. |
| 8,120,591 B2 | 2/2012 | Krah et al. |
| 8,144,125 B2 | 3/2012 | Peng et al. |
| 8,144,126 B2 | 3/2012 | Wright |
| 8,169,238 B1 | 5/2012 | Maharyta et al. |
| 8,248,084 B2 | 8/2012 | Bokma et al. |
| 8,358,142 B2 | 1/2013 | Maharyta |
| 8,400,406 B1 | 3/2013 | Kurtz et al. |
| 8,462,135 B1 | 6/2013 | Xiao et al. |
| 8,537,121 B2 | 9/2013 | XiaoPing |
| 8,542,211 B2 | 9/2013 | Elias |
| 8,692,563 B1 | 4/2014 | Maharyta |
| 2001/0012667 A1 | 8/2001 | Ma et al. |
| 2001/0048313 A1 | 12/2001 | Frank |
| 2002/0000978 A1 | 1/2002 | Gerpheide |
| 2002/0008543 A1 | 1/2002 | Nasu et al. |
| 2002/0063688 A1 | 5/2002 | Shaw et al. |
| 2002/0067348 A1 | 6/2002 | Masters et al. |
| 2002/0080014 A1 | 6/2002 | Mccarthy et al. |
| 2002/0109035 A1 | 8/2002 | Denen et al. |
| 2002/0136372 A1 | 9/2002 | Bozorgui-Nesbat |
| 2002/0140440 A1 | 10/2002 | Haase |
| 2002/0185981 A1 | 12/2002 | Dietz et al. |
| 2002/0191029 A1 | 12/2002 | Gillespie et al. |
| 2003/0014239 A1 | 1/2003 | Ichbiah et al. |
| 2003/0025679 A1 | 2/2003 | Taylor et al. |
| 2003/0058053 A1 | 3/2003 | Jeon et al. |
| 2003/0062889 A1 | 4/2003 | Ely et al. |
| 2003/0063073 A1 | 4/2003 | Geaghan et al. |
| 2003/0063428 A1 | 4/2003 | Nishi |
| 2003/0076306 A1 | 4/2003 | Zadesky et al. |
| 2003/0080755 A1 | 5/2003 | Kobayashi |
| 2003/0091220 A1 | 5/2003 | Sato et al. |
| 2003/0098858 A1 | 5/2003 | Perski et al. |
| 2003/0112021 A1 | 6/2003 | Palata et al. |
| 2003/0156098 A1 | 8/2003 | Shaw et al. |
| 2003/0160808 A1 | 8/2003 | Foote et al. |
| 2003/0161278 A1 | 8/2003 | Igura |
| 2003/0178675 A1 | 9/2003 | Nishizaka et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2003/0189419 A1 | 10/2003 | Maki et al. |
| 2003/0230438 A1 | 12/2003 | Keefer et al. |
| 2003/0232507 A1 | 12/2003 | Chen |

(56) References Cited

U.S. PATENT DOCUMENTS

| | | |
|---|---|---|
| 2004/0041798 A1 | 3/2004 | Kim |
| 2004/0056845 A1 | 3/2004 | Harkcom et al. |
| 2004/0068409 A1 | 4/2004 | Tanaka et al. |
| 2004/0082198 A1 | 4/2004 | Nakamura et al. |
| 2004/0169594 A1 | 9/2004 | Ely et al. |
| 2004/0178989 A1 | 9/2004 | Shahoian et al. |
| 2004/0178997 A1 | 9/2004 | Gillespie et al. |
| 2004/0183560 A1 | 9/2004 | Savage et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0028330 A1 | 2/2005 | Hsu |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0179668 A1 | 8/2005 | Edwards |
| 2005/0270273 A1 | 12/2005 | Marten |
| 2005/0275382 A1 | 12/2005 | Stessman et al. |
| 2005/0280639 A1 | 12/2005 | Taylor et al. |
| 2006/0012575 A1 | 1/2006 | Knapp et al. |
| 2006/0012580 A1 | 1/2006 | Perski et al. |
| 2006/0012581 A1 | 1/2006 | Haim et al. |
| 2006/0017701 A1 | 1/2006 | Marten et al. |
| 2006/0022660 A1 | 2/2006 | Itoh |
| 2006/0026535 A1 | 2/2006 | Hotelling et al. |
| 2006/0032680 A1 | 2/2006 | Elias et al. |
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0062889 A1 | 3/2006 | Houston et al. |
| 2006/0066582 A1 | 3/2006 | Lyon et al. |
| 2006/0066585 A1 | 3/2006 | Lin |
| 2006/0097991 A1* | 5/2006 | Hotelling .............. G06F 3/0416 345/173 |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0119331 A1 | 6/2006 | Jacobs et al. |
| 2006/0132111 A1 | 6/2006 | Jacobs et al. |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0221061 A1 | 10/2006 | Fry |
| 2006/0227117 A1 | 10/2006 | Proctor |
| 2006/0232559 A1 | 10/2006 | Chien et al. |
| 2006/0238518 A1 | 10/2006 | Westerman et al. |
| 2006/0256090 A1 | 11/2006 | Huppi |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1 | 12/2006 | Delorme et al. |
| 2006/0290678 A1 | 12/2006 | Lii |
| 2007/0046299 A1 | 3/2007 | Hargreaves et al. |
| 2007/0046651 A1 | 3/2007 | Sinclair et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0100566 A1 | 5/2007 | Coley |
| 2007/0109274 A1 | 5/2007 | Reynolds |
| 2007/0132737 A1 | 6/2007 | Mulligan et al. |
| 2007/0143667 A1 | 6/2007 | Deaton et al. |
| 2007/0152977 A1 | 7/2007 | Ng et al. |
| 2007/0152983 A1 | 7/2007 | Mckillop et al. |
| 2007/0164756 A1 | 7/2007 | Lee |
| 2007/0176609 A1 | 8/2007 | Ely et al. |
| 2007/0176903 A1 | 8/2007 | Dahlin et al. |
| 2007/0229468 A1 | 10/2007 | Peng et al. |
| 2007/0229469 A1 | 10/2007 | Seguine |
| 2007/0236478 A1 | 10/2007 | Geaghan et al. |
| 2007/0257894 A1 | 11/2007 | Philipp |
| 2007/0263191 A1 | 11/2007 | Shibazaki |
| 2007/0268243 A1 | 11/2007 | Choo et al. |
| 2007/0268265 A1 | 11/2007 | Xiaoping |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2007/0273659 A1 | 11/2007 | XiaoPing et al. |
| 2007/0291013 A1 | 12/2007 | Won |
| 2007/0296709 A1 | 12/2007 | GuangHai |
| 2008/0007529 A1 | 1/2008 | Paun et al. |
| 2008/0007533 A1 | 1/2008 | Hotelling |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0041639 A1 | 2/2008 | Westerman et al. |
| 2008/0041640 A1 | 2/2008 | Gillespie et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0042989 A1 | 2/2008 | Westerman et al. |
| 2008/0042994 A1 | 2/2008 | Gillespie et al. |
| 2008/0047764 A1 | 2/2008 | Lee et al. |
| 2008/0048997 A1 | 2/2008 | Gillespie et al. |
| 2008/0062139 A1 | 3/2008 | Hotelling et al. |
| 2008/0062140 A1 | 3/2008 | Hotelling et al. |
| 2008/0062148 A1 | 3/2008 | Hotelling et al. |
| 2008/0068100 A1 | 3/2008 | Goodnow et al. |
| 2008/0072192 A1 | 3/2008 | Lenahan |
| 2008/0079699 A1 | 4/2008 | Mackey |
| 2008/0088595 A1 | 4/2008 | Liu et al. |
| 2008/0100280 A1 | 5/2008 | Masson et al. |
| 2008/0111714 A1 | 5/2008 | Kremin |
| 2008/0116904 A1 | 5/2008 | Reynolds et al. |
| 2008/0128182 A1 | 6/2008 | Westerman et al. |
| 2008/0150906 A1 | 6/2008 | Grivna |
| 2008/0158145 A1 | 7/2008 | Westerman |
| 2008/0158169 A1 | 7/2008 | Westerman et al. |
| 2008/0158177 A1 | 7/2008 | Wilson et al. |
| 2008/0158178 A1 | 7/2008 | Hotelling et al. |
| 2008/0158183 A1 | 7/2008 | Hotelling et al. |
| 2008/0158184 A1 | 7/2008 | Land et al. |
| 2008/0162997 A1 | 7/2008 | Vu et al. |
| 2008/0165134 A1 | 7/2008 | Krah |
| 2008/0179112 A1 | 7/2008 | Qin et al. |
| 2008/0180399 A1 | 7/2008 | Cheng |
| 2008/0196945 A1 | 8/2008 | Konstas |
| 2008/0246723 A1 | 10/2008 | Baumbach |
| 2008/0250864 A1 | 10/2008 | Shipton |
| 2008/0266263 A1 | 10/2008 | Motaparti et al. |
| 2008/0277171 A1 | 11/2008 | Wright |
| 2008/0278178 A1 | 11/2008 | Philipp |
| 2008/0309623 A1 | 12/2008 | Hotelling et al. |
| 2008/0309634 A1 | 12/2008 | Hotelling et al. |
| 2009/0002206 A1 | 1/2009 | Kremin |
| 2009/0096758 A1 | 4/2009 | Hotelling et al. |
| 2009/0153152 A1 | 6/2009 | Maharyta et al. |
| 2009/0179838 A1 | 7/2009 | Yamashita et al. |
| 2009/0322351 A1 | 12/2009 | McLeod |
| 2010/0001973 A1 | 1/2010 | Hotelling et al. |
| 2010/0006350 A1 | 1/2010 | Elias |
| 2010/0013791 A1 | 1/2010 | Haga et al. |
| 2010/0060608 A1 | 3/2010 | Yousefpor |
| 2010/0098257 A1 | 4/2010 | Mueller |
| 2010/0328256 A1 | 12/2010 | Harada et al. |
| 2010/0328262 A1 | 12/2010 | Huang et al. |
| 2011/0025629 A1 | 2/2011 | Grivna et al. |

(56) References Cited

U.S. PATENT DOCUMENTS

| | | | |
|---|---|---|---|
| 2011/0133815 | A1 | 6/2011 | Caldwell et al. |
| 2011/0156724 | A1 | 6/2011 | Bokma et al. |
| 2011/0234523 | A1 | 9/2011 | Chang et al. |
| 2012/0043140 | A1 | 2/2012 | Peterson et al. |
| 2012/0043973 | A1 | 2/2012 | Kremin |
| 2012/0043976 | A1 | 2/2012 | Bokma et al. |
| 2012/0327041 | A1 | 12/2012 | Harley et al. |
| 2013/0049771 | A1 | 2/2013 | Peng et al. |
| 2013/0162585 | A1 | 6/2013 | Schwartz |
| 2013/0207906 | A1 | 8/2013 | Yousefpor et al. |
| 2014/0266257 | A1 | 9/2014 | Maharyta |

FOREIGN PATENT DOCUMENTS

| | | |
|---|---|---|
| JP | 04012528 | 1/1992 |
| JP | 05283519 B1 | 10/1993 |
| JP | 6104334 A | 4/1994 |
| JP | 6163528 A | 6/1994 |
| WO | 0002188 A | 1/2000 |
| WO | 2002003368 A1 | 1/2002 |
| WO | 2011005977 A2 | 1/2011 |

OTHER PUBLICATIONS

"Sigma-Delta ADCs and DACs, AN-283 Application Note, Analog Devices," 1993; Downloaded from <http://www.analog.com/UpoloadedFiles/Application_Notes/292524291525717245054923680458171AN283.pdf>; 16 pages.

"The Virtual Keyboard: I-Tech Bluetooth/Serial Virtual Laser Keyboard Available Now!" The Virtual Laser Keyboard (VKB) Online Worldwide Shop, <http://www.virtual-laser-keyboard.com>, downloaded Apr. 13, 2006; 4 pages.

Andrew S. Tanenbaum with contributions from James R. Goodman, "Structured Computer Organization," 1999, Prentice Hall, Fourth Edition; 32 pages.

U.S. Appl. No. 13/049,798: "Capacitance to Code Converter With Sigma-Delta Modulator," Kremin, filed Mar. 16, 2011; 77 pages.

U.S. Appl. No. 11/396,179: "Apparatus and Method for Reducing Average Scan Rate to Detect a Conductive Object on a Sensing Device" Tao Peng et al., filed Mar. 30, 2006; 75 pages.

U.S. Appl. No. 11/493,350: "Technique for Increasing the Sensitivity of Capacitive Sensor Arrays," Lee et al., filed Jul. 25, 2006; 48 pages.

U.S. Appl. No. 11/600,255: "Capacitance to Code Converter With Sigma-Delta Modulator," Kremin, filed Nov. 14, 2006; 102 pages.

U.S. Appl. No. 11/709,866: "Input/Output Multiplexer Bus," Dennis R. Sequine, filed Feb. 21, 2007; 33 pages.

U.S. Appl. No. 11/709,897: "Preventing Unintentional Activation of a Sensor Element of a Sensing Device" Jason Konstas et al., filed Feb. 21, 2007; 97 pages.

U.S. Appl. No. 11/729,818: "Touch Detection Techniques for Capacitive Touch Sense Sysytems" Louis W. Bokma et al., filed Mar. 28, 2007; 42 pages.

U.S. Appl. No. 11/801,115: "Reducing Sleep Current in a Capacitance Sensing System" David G. Wright et al., filed May 7, 2007; 72 pages.

U.S. Appl. No. 11/823,982: "Capacitance Measurement Systems and Methods" Louis Bokma et al., filed Jun. 29, 2007; 24 pages.

U.S. Appl. No. 12/040,387: "Touch Sensing," Peterson et al., filed Feb. 29, 2008; 28 pages.

U.S. Appl. No. 12/166,228 "Capacitance to Frequency Converter," Andriy Maharyta et al., filed Jul. 1, 2008; 29 pages.

U.S. Appl. No. 12/197,466: "Radical Oxidation Process for Fabricating a Nonvolatile Charge Trap Memory Device," Ramkumar et al., filed Aug. 25, 2008; 68 pages.

U.S. Appl. No. 12/239,692: "System and Method to Measure Capacitance of Capacitive Sensor Array" Nathan Mayal et al., filed Sep. 26, 2008; 36 pages.

U.S. Appl. No. 12/332,980: "Compensation Circuit for a TX-RX Capacitive Sensor," Andriy Maharyta, filed Dec. 11, 2008; 55 pages.

U.S. Appl. No. 12/380,141: "Capacitive Field Sensor With Sigma-Delta Modulator", Rystun et al., filed Feb. 23, 2009, 48 pages.

U.S. Appl. No. 12/395,462: "Methods and Circuits for Measuring Mutual and Self Capacitance," Andriy Maharyta, filed Feb. 27, 2009; 44 pages.

U.S. Appl. No. 12/395,959: "Multi-Touch Sensing Method" Dana Olson et al., filed Mar. 2, 2009; 22 pages.

U.S. Appl. No. 12/606,147: "Methods and Circuits for Measuring Mutual and Self Capacitance," Andriy Maharyta, filed Oct. 26, 2009; 49 pages.

U.S. Appl. No. 12/618,661: "Automatic Tuning of a Capacitive Sensing Device" Dana Olson, filed Nov. 13, 2009; 30 pages.

U.S. Appl. No. 12/861,812: "Capacitance Measurement Systems and Methods" Louis Bokma et al., filed Aug. 23, 2010; 24 pages.

U.S. Appl. No. 13/047,620: "Touch Detection Techniques for Capacitive Touch Sense Systems ", filed Mar. 14, 2011, 38 pages.

U.S. Appl. No. 13/191,806: "Capacitance Measurement Systems and Methods", filed Jul. 27, 2011, 38 pages.

U.S. Appl. No. 13/306,840: "Input/Output Multiplexer Bus," Dennis R. Seguine, filed Nov. 29, 2011; 31 pages.

U.S. Appl. No. 13/342,942: "Capacitive Field Sensor With Sigma-Delta Modulator" filed Jan. 3, 2012; 41 pages.

U.S. Appl. No. 13/345,504: "Compensation Circuit for a TX-RX Capacitive Sensor" filed Jan. 6, 2012; 55 pages.

U.S. Appl. No. 13/720,861: "Methods and Circuits for Measuring Mutual and Self Capacitance" Andriy Maharyta et al., filed Dec. 19, 2012; 38 pages.

U.S. Appl. No. 13/948,885: "Apparatus and Method for Reducing Average Scan Rate to Detect a Conductive Object on a Sensing Device" Tao Peng et al., filed Jul. 23, 2013; 65 pages.

U.S. Appl. No. 14/325,582: "Waterproof Scanning of a Capacitance Sense Array" Michael Patrick Hills et al., filed Jul. 8, 2014; 41 pages.

U.S. Appl. No. 60/220,921: "Method for Automatically Tuning a Capacitive sensing Device" Dana Olson, filed Jun. 26, 2009; 13 pages.

U.S. Appl. No. 60/947,865: "Capacitive Field Sensor with Sigma-Delt Modulator," Viktor Kremin, filed Jul. 3, 2007; 33 pages.

U.S. Appl. No. 60/947,871: "Capacitance to Frequency Converter" Andrey Maharita et al., filed Jul. 3, 2007; 21 pages.

U.S. Appl. No. 61/016,123 "Capacitive Field Sensor With Sigma-Delta Modulator" filed Dec. 21, 2007, 23 pages.

U.S. Appl. No. 61/023,988: "Touch Sensing" Jon Peterson, et al., filed Jan. 28, 2008; 26 pages.

U.S. Appl. No. 61/024,158 "Multi-Touch Sensing Method With Differential Input" Dana Olson et al., filed Jan. 28, 2008; 19 pages.

U.S. Appl. No. 61/030,526: "Capacitive Sensing Universal System and Method" Andriy Ryshtun., filed Feb. 21, 2008; 22 pages.

U.S. Appl. No. 61/067,539 "Methods and Circuits for Measuring Mutual and Self Capacitance" Andriy Maharyta et al., filed Feb. 27, 2008; 40 pages.

U.S. Appl. No. 61/067,743 "Multi-Touch Sensing Method with Differential Input" Dana Olson et al., filed Feb. 29, 2008; 19 pages.

Chapweske, Adam; "The PS/2 Mouse Interface," PS/2 Mouse Interfacing, 2001, retrieved on May 18, 2006; 10 pages.

Chris Mack, "Semiconductor Lithography—The Basic Process," Gentleman Scientist, downloaded Apr. 20, 2006, http://www.lithoguru.com/scientist/lithobasics.html; 12 pages.

CSD User Module Data Sheet, Cypress Semiconductor Corporation CSD v 1.0, Oct. 23, 2006; 58 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

(56) References Cited

OTHER PUBLICATIONS

Cypress Semiconductor Corporation, "PSoC Mixed-Signal Controllers," Production Description; <http://www.cypress.com/portal/server>; retrieved on Sep. 27, 2005; 2 pages.
Cypress Semiconductor Corporation, "Release Notes sm017," Jan. 24, 2007; 3 pages.
Dennis Seguine, "Capacitive Switch Scan," Cypress Application Note AN2233a, Revision B, Apr. 14, 2005; 6 pages.
USPTO Notice of Allowance for U.S. Appl. No. 13/049,556 dated Nov. 7, 2014; 12 pages.
USPTO Notice of Allowance for U.S. Appl. No. 13/049,798 dated Jan. 30, 2015; 14 pages.
USPTO Notice of Allowance for U.S. Appl. No. 13/191,806 dated Jan. 30, 2015; 9 pages.
USPTO Notice of Allowance for U.S. Appl. No. 13/720,861 dated Jan. 30, 2014; 8 pages.
USPTO Notice of Allowance for U.S. Appl. No. 13/720,861 dated Dec. 3, 2013; 13 pages.
USPTO Notice of Allowance for U.S. Appl. No. 13/741,145 dated Feb. 23, 2015; 5 pages.
USPTO Notice of Allowance for U.S. Appl. No. 13/917,528 dated Feb. 4, 2015; 13 pages.
USPTO Notice of Allowance for U.S. Appl. No. 13/948,885 dated Jan. 12, 2015; 8 pages.
USPTO Notice of Allowance for U.S. Appl. No. 13/950,672 dated Mar. 4, 2015; 8 pages.
USPTO Notice of Allowance, U.S. Appl. No. 11/601,465, dated Apr. 22, 2010, 41 pages.
USPTO Notice of Allowance, U.S. Appl. No. 11/601,465, dated Jun. 28, 2011, 21 pages.
USPTO Notice of Allowance, U.S. Appl. No. 11/601,465, dated Aug. 10, 2010, 17 pages.
USPTO Notice of Allowance, U.S. Appl. No. 11/601,465, dated Nov. 26, 2010, 16 pages.
USPTO Notice of Allowance, U.S. Appl. No. 11/729,818, dated Jan. 26, 2011, 7 pages.
USPTO Notice of Allowance, U.S. Appl. No. 11/729,818, dated May 9, 2011, 8 pages.
USPTO Notice of Allowance, U.S. Appl. No. 11/729,818, dated Jun. 9, 2011, 8 pages.
USPTO Notice of Allowance, U.S. Appl. No. 11/729,818, dated Oct. 5, 2010, 7 pages.
USPTO Notice of Allowance, U.S. Appl. No. 11/729,818, dated Jun. 25, 2010, 7 pages.
USPTO Notice of Allowance, U.S. Appl. No. 13/047,620, dated Apr. 11, 2012, 19 pages.
USPTO Requirement for Restriction for U.S. Appl. No. 12/167,100 dated Aug. 20, 2010; 6 pages.
USPTO Requirement for Restriction for U.S. Appl. No. 12/239,692 dated Sep. 27, 2010; 7 pages.
USPTO Requirement for Restriction for U.S. Appl. No. 12/380,141 dated Jul. 8, 2011; 6 pages.
USPTO Requirement for Restriction for U.S. Appl. No. 12/395,462 dated May 13, 2011; 6 pages.
USPTO Requirement for Restriction/Election for U.S. Appl. No. 11/337,272 dated Sep. 11, 2006; 5 pages.
USPTO Requirement Restriction for U.S. Appl. No. 11/824,249 dated Feb. 17, 2011; 5 pages.
USPTO Restriction Requirement, U.S. Appl. No. 11/601,465, dated Nov. 1, 2007, 5 pages.
USPTO Restriction Requirement, U.S. Appl. No. 13/047,620, dated Feb. 27, 2012, 7 pages.
Van Ess, D., "Understanding Switched Capacitor Analog Blocs," AN2041, Application Note, Mar. 30, 2004, 16 pages.
Van Ess, David; "Simulating a 555 Timer with PSoC," Cypress Semiconductor Corporation, Application Note AN2286, May 19, 2005; 10 pages.
Vladislav Golub, Ph.D., "Sigma-Delta ADCs", pub. date: Jun. 17, 2003, 10 pages.
Wikipedia, The Free Encyclopedia "IBM PC Keyboard" http://en.wikipedia.or/wiki/PC_keyboard>accessed May 19, 2006; 3 pages.
Written Opinion of the International Searching Authority for International Application No. PCT/US08/06627 mailed Aug. 26, 2008; 5 pages.
Written Opinion of the International Searching Authority for International Application No. PCT/US08/13622 mailed Feb. 9, 2009; 5 pages.
Written Opinion of the International Searching Authority for International Application No. PCT/US08/60696 mailed Sep. 22, 2008; 4 pages.
USPTO Final Rejection for U.S. Appl. No. 11/601,465 dated Jul. 9, 2008; 10 pages.
USPTO Final Rejection for U.S. Appl. No. 11/709,897 dated Jul. 29, 2010; 24 pages.
USPTO Final Rejection for U.S. Appl. No. 11/729,818 dated Jul. 2, 2009; 14 pages.
USPTO Final Rejection for U.S. Appl. No. 11/824,249 dated Dec. 22, 2011; 10 pages.
USPTO Final Rejection for U.S. Appl. No. 11/983,291 dated Aug. 12, 2009; 10 pages.
USPTO Final Rejection for U.S. Appl. No. 12/040,387 dated Nov. 21, 2011; 13 pages.
USPTO Final Rejection for U.S. Appl. No. 12/166,228 dated Jan. 4, 2011; 9 pages.
USPTO Final Rejection for U.S. Appl. No. 12/166,228 dated May 28, 2010; 12 pages.
USPTO Final Rejection for U.S. Appl. No. 12/239,692 dated May 9, 2011; 10 pages.
USPTO Final Rejection for U.S. Appl. No. 12/332,980 dated May 31, 2011; 11 pages.
USPTO Final Rejection for U.S. Appl. No. 12/367,279 dated Apr. 1, 2010; 6 pages.
USPTO Final Rejection for U.S. Appl. No. 12/395,462 dated Jan. 3, 2012; 6 pages.
USPTO Final Rejection for U.S. Appl. No. 12/395,969 dated Jul. 17, 2012; 25 pages.
USPTO Final Rejection for U.S. Appl. No. 12/861,812 dated Oct. 18, 2011; 10 pages.
USPTO Final Rejection for U.S. Appl. No. 13/670,671 dated May 11, 2015; 13 pages.
USPTO Final Rejection for U.S. Appl. No. 13/720,861 dated May 14, 2013; 7 pages.
USPTO Final Rejection for U.S. Appl. No. 13/720,861 dated Aug. 2, 2013; 9 pages.
USPTO Final Rejection for U.S. Appl. No. 13/741,090 dated Jan. 22, 2015; 20 pages.
USPTO Final Rejection for U.S. Appl. No. 13/741,145 dated Jan. 7, 2015; 23 pages.
USPTO Final Rejection for U.S. Appl. No. 14/275,387 dated Jan. 12, 2015; 16 pages.
USPTO Non Final Rejection for U.S. Appl. No. 11/600,255 dated Mar. 29, 2010; 10 pages.
USPTO Non Final Rejection for U.S. Appl. No. 11/823,982 dated Mar. 19, 2009; 14 pages.
USPTO Non Final Rejection for U.S. Appl. No. 12/166,228 dated Aug. 11, 2010; 8 pages.
USPTO Non Final Rejection for U.S. Appl. No. 12/199,228 dated Dec. 30, 2009; 11 pages.
USPTO Non Final Rejection for U.S. Appl. No. 12/380,141 dated Sep. 5, 2012; 6 pages.
USPTO Non Final Rejection for U.S. Appl. No. 13/191,806 dated Jul. 24, 2014; 19 pages.
USPTO Non Final Rejection for U.S. Appl. No. 13/670,671 dated Dec. 29, 2014; 8 pages.
USPTO Non Final Rejection for U.S. Appl. No. 13/741,090 dated Apr. 2, 2015; 19 pages.
USPTO Non Final Rejection for U.S. Appl. No. 13/741,090 dated Oct. 28, 2014; 18 pages.
USPTO Non Final Rejection for U.S. Appl. No. 13/741,145 dated Oct. 29, 2014; 21 pages.
USPTO Non-Final Rejection for U.S. Appl. No. 09/975,105 dated Jan. 19, 2006; 5 pages.

(56) References Cited

OTHER PUBLICATIONS

USPTO Non-Final Rejection for U.S. Appl. No. 09/975,105 dated Apr. 19, 2005; 9 pages.
USPTO Non-Final Rejection for U.S. Appl. No. 11/230,719 dated Jan. 16, 2007; 8 pages.
USPTO Non-Final Rejection for U.S. Appl. No. 11/230,719 dated May 11, 2006; 5 pages.
USPTO Non-Final Rejection for U.S. Appl. No. 11/230,719 dated May 25, 2007; 6 pages.
USPTO Non-Final Rejection for U.S. Appl. No. 11/230,719 dated Aug. 28, 2006; 7 pages.
USPTO Non-Final Rejection for U.S. Appl. No. 11/273,708 dated Mar. 19, 2007; 16 pages.
USPTO Non-Final Rejection for U.S. Appl. No. 11/337,272 dated May 17, 2007; 11 pages.
USPTO Non-Final Rejection for U.S. Appl. No. 11/337,272 dated Oct. 24, 2006; 9 pages.
USPTO Non-Final Rejection for U.S. Appl. No. 11/395,417 dated Apr. 25, 2008; 7 pages.
USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010; 10 pages.
USPTO Non-Final Rejection for U.S. Appl. No. 11/437,517 dated Aug. 5, 2009; 9 pages.
USPTO Non-Final Rejection for U.S. Appl. No. 11/442,044 dated Mar. 31, 2009; 12 pages.
USPTO Non-Final Rejection for U.S. Appl. No. 11/442,212 dated Feb. 25, 2011; 13 pages.
USPTO Non-Final Rejection for U.S. Appl. No. 11/442,212 dated Jul. 6, 2010; 13 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010; 10 pages.
USPTO Non-Final Rejection for U.S. Appl. No. 11/477,179 dated Nov. 18, 2009; 10 pages.
USPTO Notice of Allowance for U.S. Appl. No. 11/600,255 dated Jul. 27, 2010; 6 pages.
USPTO Notice of Allowance for U.S. Appl. No. 11/601,465 dated Jan. 11, 2010; 18 pages.
USPTO Notice of Allowance for U.S. Appl. No. 11/601,465 dated Mar. 11, 2011; 17 pages.
USPTO Notice of Allowance for U.S. Appl. No. 11/601,465 dated May 8, 2009; 6 pages.
USPTO Notice of Allowance for U.S. Appl. No. 11/601,465 dated Sep. 10, 2009; 7 pages.
USPTO Notice of Allowance for U.S. Appl. No. 11/601,465 dated Oct. 7, 2011; 7 pages.
USPTO Notice of Allowance for U.S. Appl. No. 11/700,314 dated Sep. 16, 2010; 8 pages.
USPTO Notice of Allowance for U.S. Appl. No. 11/709,866 dated Feb. 16, 2010; 7 pages.
USPTO Notice of Allowance for U.S. Appl. No. 11/729,818 dated Feb. 24, 2010; 6 pages.
USPTO Notice of Allowance for U.S. Appl. No. 11/729,818 dated Nov. 13, 2009; 7 pages.
USPTO Notice of Allowance for U.S. Appl. No. 11/823,982 dated Feb. 1, 2010; 8 pages.
USPTO Notice of Allowance for U.S. Appl. No. 11/823,982 dated May 14, 2010; 8 pages.
USPTO Notice of Allowance for U.S. Appl. No. 11/823,982 dated Oct. 6, 2009; 12 pages.
USPTO Notice of Allowance for U.S. Appl. No. 11/880,963 dated Oct. 2, 2009; 4 pages.
USPTO Notice of Allowance for U.S. Appl. No. 11/983,291 dated Mar. 9, 2010; 7 pages.
USPTO Notice of Allowance for U.S. Appl. No. 11/983,291 dated Jun. 21, 2010; 7 pages.
USPTO Notice of Allowance for U.S. Appl. No. 11/983,291 dated Sep. 29, 2010; 7 pages.
USPTO Notice of Allowance for U.S. Appl. No. 11/983,291 dated Oct. 22, 2009; 7 pages.
USPTO Notice of Allowance for U.S. Appl. No. 12/040,387 dated Mar. 29, 2012; 8 pages.
USPTO Notice of Allowance for U.S. Appl. No. 12/166,228 dated Mar. 22, 2011; 8 pages.
USPTO Notice of Allowance for U.S. Appl. No. 12/167,100 dated Jan. 12, 2011; 8 pages.
USPTO Notice of Allowance for U.S. Appl. No. 12/167,100 dated Apr. 29, 2011; 8 pages.
USPTO Notice of Allowance for U.S. Appl. No. 12/167,100 dated Jun. 28, 2011; 8 pages.
USPTO Notice of Allowance for U.S. Appl. No. 12/167,100 dated Sep. 1, 2011; 8 pages.
USPTO Notice of Allowance for U.S. Appl. No. 12/167,100 dated Sep. 30, 2010; 7 pages.
USPTO Notice of Allowance for U.S. Appl. No. 12/239,692 dated Jan. 5, 2012; 8 pages.
USPTO Notice of Allowance for U.S. Appl. No. 12/239,692 dated May 16, 2012; 8 pages.
USPTO Notice of Allowance for U.S. Appl. No. 12/239,692 dated Jun. 25, 2012; 8 pages.
USPTO Notice of Allowance for U.S. Appl. No. 12/239,692 dated Aug. 15, 2012; 8 pages.
USPTO Notice of Allowance for U.S. Appl. No. 12/239,692 dated Sep. 18, 2012; 8 pages.
USPTO Notice of Allowance for U.S. Appl. No. 12/239,692 dated Oct. 13, 2011; 8 pages.
USPTO Notice of Allowance for U.S. Appl. No. 12/332,980 dated Oct. 4, 2011; 5 pages.
USPTO Notice of Allowance for U.S. Appl. No. 12/367,279 dated Aug. 23, 2010; 7 pages.
USPTO Notice of Allowance for U.S. Appl. No. 12/380,141 dated Jan. 26, 2012; 7 pages.
USPTO Notice of Allowance for U.S. Appl. No. 12/380,141 dated Apr. 10, 2012; 7 pages.
USPTO Notice of Allowance for U.S. Appl. No. 12/380,141 dated May 15, 2012; 7 pages.
USPTO Notice of Allowance for U.S. Appl. No. 12/380,141 dated Jun. 14, 2012; 8 pages.
USPTO Notice of Allowance for U.S. Appl. No. 12/380,141 dated Jul. 31, 2012; 5 pages.
USPTO Notice of Allowance for U.S. Appl. No. 12/395,462 dated May 4, 2012; 8 pages.
USPTO Notice of Allowance for U.S. Appl. No. 12/395,462 dated Jul. 20, 2012; 6 pages.
USPTO Notice of Allowance for U.S. Appl. No. 12/395,462 dated Aug. 29, 2012; 5 pages.
USPTO Notice of Allowance for U.S. Appl. No. 12/395,462 dated Oct. 2, 2012; 5 pages.
USPTO Notice of Allowance for U.S. Appl. No. 12/395,462 dated Nov. 14, 2012; 5 pages.
USPTO Notice of Allowance for U.S. Appl. No. 12/395,969 dated Mar. 23, 2015; 5 pages.
USPTO Notice of Allowance for U.S. Appl. No. 12/606,147 dated Aug. 13, 2012; 7 pages.
USPTO Notice of Allowance for U.S. Appl. No. 12/844,798 dated Feb. 25, 2015; 8 pages.
USPTO Notice of Allowance for U.S. Appl. No. 12/844,798 dated Oct. 7, 2014; 8 pages.
USPTO Notice of Allowance for U.S. Appl. No. 12/844,798 dated Dec. 16, 2014; 8 pages.
USPTO Non-Final Rejection for U.S. Appl. No. 11/484,085 dated Sep. 17, 2009; 8 pages.
USPTO Non-Final Rejection for U.S. Appl. No. 11/493,350 dated Jun. 16, 2010; 8 pages.
USPTO Non-Final Rejection for U.S. Appl. No. 11/493,350 dated Nov. 9, 2010; 9 pages.

(56) References Cited

OTHER PUBLICATIONS

USPTO Non-Final Rejection for U.S. Appl. No. 11/502,267 dated Aug. 11, 2008; 10 pages.
USPTO Non-Final Rejection for U.S. Appl. No. 11/512,042 dated Jul. 13, 2010; 14 pages.
USPTO Non-Final Rejection for U.S. Appl. No. 11/600,255 dated Mar. 29, 2010; 10 pages.
USPTO Non-Final Rejection for U.S. Appl. No. 11/600,896 dated May 14, 2010; 15 pages.
USPTO Non-Final Rejection for U.S. Appl. No. 11/600,896 dated Dec. 16, 2009; 13 pages.
USPTO Non-Final Rejection for U.S. Appl. No. 11/601,465 dated Oct. 2, 2008; 10 pages.
USPTO Non-Final Rejection for U.S. Appl. No. 11/601,465 dated Dec. 28, 2007; 16 pages.
USPTO Non-Final Rejection for U.S. Appl. No. 11/700,314 dated Mar. 26, 2010; 7 pages.
USPTO Non-Final Rejection for U.S. Appl. No. 11/709,897 dated Feb. 16, 2010; 21 pages.
USPTO Non-Final Rejection for U.S. Appl. No. 11/729,818 dated Dec. 17, 2008; 12 pages.
USPTO Non-Final Rejection for U.S. Appl. No. 11/824,249 dated Mar. 30, 2012; 10 pages.
USPTO Non-Final Rejection for U.S. Appl. No. 11/824,249 dated May 25, 2011; 9 pages.
USPTO Non-Final Rejection for U.S. Appl. No. 11/880,963 dated Jun. 12, 2009; 10 pages.
USPTO Non-Final Rejection for U.S. Appl. No. 11/967,243 dated Sep. 17, 2009; 9 pages.
USPTO Non-Final Rejection for U.S. Appl. No. 11/983,291 dated Mar. 9, 2009; 9 pages.
USPTO Non-Final Rejection for U.S. Appl. No. 12/040,387 dated Jun. 30, 2011; 12 pages.
USPTO Non-Final Rejection for U.S. Appl. No. 12/166,228 dated Aug. 11, 2010; 8 pages.
USPTO Non-Final Rejection for U.S. Appl. No. 12/166,228 dated Dec. 30, 2009; 11 pages.
USPTO Non-Final Rejection for U.S. Appl. No. 12/239,692 dated Nov. 29, 2010; 9 pages.
USPTO Non-Final Rejection for U.S. Appl. No. 12/332,980 dated Dec. 22, 2010; 9 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Sep. 5, 2012; 6 pages.
USPTO Non-Final Rejection for U.S. Appl. No. 12/380,141 dated Sep. 19, 2011; 6 pages.
USPTO Non-Final Rejection for U.S. Appl. No. 12/395,462 dated Aug. 23, 2011; 5 pages.
USPTO Non-Final Rejection for U.S. Appl. No. 12/395,969 dated Dec. 16, 2011; 17 pages.
USPTO Non-Final Rejection for U.S. Appl. No. 12/606,147 dated Aug. 23, 2011; 6 pages.
USPTO Non-Final Rejection for U.S. Appl. No. 12/861,812 dated Apr. 15, 2011; 26 pages.
USPTO Non-Final Rejection for U.S. Appl. No. 13/590,390 dated Mar. 10, 2015; 14 pages.
USPTO Non-Final Rejection for U.S. Appl. No. 13/720,861 dated Mar. 11, 2013; 9 pages.
USPTO Non-Final Rejection for U.S. Appl. No. 13/948,885 dated Nov. 25, 2014; 10 pages.
USPTO Non-Final Rejection for U.S. Appl. No. 14/275,387 dated May 1, 2015; 19 pages.
USPTO Notice of Allowance for U.S. Appl. No. 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,666 dated Aug. 2, 2006; 11 pages.
USPTO Notice of Allowance for U.S. Appl. No. 11/230,719 dated Jan. 16, 2008; 4 pages.
USPTO Notice of Allowance for U.S. Appl. No. 11/273,708 dated Aug. 9, 2007; 4 pages.
USPTO Notice of Allowance for U.S. Appl. No. 11/337,272 dated Aug. 15, 2007; 9 pages.
USPTO Notice of Allowance for U.S. Appl. No. 11/395,417 dated Nov. 6, 2008; 7 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Notice of Allowance for U.S. Appl. No. 11/489,944 dated May 24, 2007; 2 pages.
USPTO Notice of Allowance for U.S. Appl. No. 11/600,255 dated Apr. 12, 2012; 7 pages.
USPTO Notice of Allowance for U.S. Appl. No. 11/600,255 dated Apr. 20, 2011; 7 pages.
USPTO Notice of Allowance for U.S. Appl. No. 11/600,255 dated May 30, 2012; 7 pages.
USPTO Notice of Allowance for U.S. Appl. No. 11/600,255 dated Jun. 16, 2011; 7 pages.
USPTO Notice of Allowance for U.S. Appl. No. 11/600,255 dated Dec. 9, 2010; 6 pages.
European Search Report for European Application No. 12186513.3 dated Jun. 3, 2014; 9 pages.
International Search Report and Written Opinion of the European Patent Office Application No. 10805001.4, PCT/US2010043590 dated Apr. 10, 2014; 7 pages.
International Search Report for International Application No. PCT/US05/23468 dated Aug. 25, 2006; 2 pages.
International Search Report for International Application No. PCT/US08/13622 dated Feb. 9, 2009; 2 pages.
Janusz Mlodzianowski, "A Simple Multipurpose Logic Analyzer," Dec. 1997, Circuit Cellar Ink, Issue 89, pp. 28-36.
Kremin, V. "Noise resistant capacitive sensor," U.S. Appl. No. 11/824,4249, filed Jun. 29, 2007; 41 pages.
Larry K. Baxter, "Capacitive Sensors, Design and Applications," IEEE Press, The Institute of Electrical and Electronics Engineers Inc., Aug. 1996, pp. 177-187; 12 pages.
Lee, Mark; "EMC Design Considerations for PSoC CapSense Applications," Cypress Semiconductor Corporation, Application Note AN2318; Sep. 16, 2005; 6 pages.
Mark Lee, "CapSense Best Practice", Cypress Application Note AN2394, Rev.**, Oct. 19, 2006, pp. 1-10.
Microchip Technology Inc., Document No. DS31002S, 1997 Microchip Technology, Inc., p. 2-13 (cited by Applicant; available at http://ww1.microchip.com/downloads/en/devicedoc/31002a.pdf; no unlocked version available).
Milton Ohring, "The Materials Science of Thin Films: Deposition and Structure," 2nd Edition, Academic Press, 2002, pp. 336-337; 4 pages.
Min et al., "Offset Compensation of Capacitive Sensors for Electrostatic Microactuators," ISIE 2001, Pusan Korea, pp. 2114-2117.
U.S. Appl. No. 61/108,450: "Alternative Realizations of the CSX (TxRx-I) Sensing Scheme for ITO Panels," Andriy Maharyta, filed Oct. 24, 2008; 7 pages.
Ryan Seguine et al., "Layout Guidelines for PSoC CapSense", Cypress Application Note AN2292, Revision B, Oct. 31, 2005, pp. 1-15.
Sangil Park, "Motorola Digital Signal Processors, Principles of Sigma-Delta Modulation for Analog-to-Digital Converters," Rev. 1, downloaded from <http://digitalsignallabs.com/SigmaDelta.pdf>, Mar. 1997; 64 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; pp. 1-10, Jul. 22, 2005; 13 pages.
SIPO Office Action for Application No. 201080042141. X dated Oct. 28, 2014; 6 pages.
SIPPO Office Action for International Application No. 201080042141.X dated Apr. 23, 2014; 6 pages.

(56) References Cited

OTHER PUBLICATIONS

Ted Tsui, "Migrating from CSR to CSD," Cypress Semiconductor Corporation, Application Note AN2408, Feb. 8, 2007, http://www.cypress.com.
The Authoritative Dictionary of IEEE Standards Terms, 2000, IEEE Press Publications, 7th Edition, pp. 1133-1134; 4 pages.
The Written Opinion of the International Searching Authority for International Application No. PCT/US05/23468 dated Aug. 25, 2006; 7 pages.
USPTO Advisory Action for U.S. Appl. No. 11/230,719 dated Nov. 30, 2007; 3 pages.
USPTO Advisory Action for U.S. Appl. No. 11/337,272 dated Apr. 3, 2007; 3 pages.
USPTO Advisory Action for U.S. Appl. No. 11/395,417 dated Jul. 6, 2007; 3 pages.
USPTO Advisory Action for U.S. Appl. No. 11/437,517 dated Apr. 7, 2010; 3 pages.
USPTO Advisory Action for U.S. Appl. No. 11/442,212 dated Jan. 5, 2011; 3 pages.
USPTO Advisory Action for U.S. Appl. No. 11/442,212 dated Dec. 17, 2009; 3 pages.
USPTO Advisory Action for U.S. Appl. No. 11/477,179 dated Jun. 7, 2010; 3 pages.
USPTO Advisory Action for U.S. Appl. No. 11/512,042 dated Feb. 23, 2011; 3 pages.
USPTO Advisory Action for U.S. Appl. No. 12/332,980 dated Aug. 9, 2011; 3 pages.
USPTO Advisory Action for U.S. Appl. No. 12/367,279 dated Jun. 25, 2010; 3 pages.
USPTO Advisory Action for U.S. Appl. No. 12/395,462 dated Mar. 28, 2012; 2 pages.
USPTO Advisory Action for U.S. Appl. No. 12/395,969 dated Sep. 21, 2012; 3 pages.
USPTO Advisory Action for U.S. Appl. No. 13/720,861 dated Sep. 18, 2013; 3 pages.
USPTO Final Rejection for U.S. Appl. No. 09/975,105 dated Jul. 13, 2006; 7 pages.
USPTO Final Rejection for U.S. Appl. No. 11/230,719 dated Sep. 7, 2007; 9 pages.
USPTO Final Rejection for U.S. Appl. No. 11/273,708 dated Jul. 5, 2007; 8 pages.
USPTO Final Rejection for U.S. Appl. No. 11/337,272 dated Feb. 2, 2007; 11 pages.
USPTO Final Rejection for U.S. Appl. No. 11/395,417 dated Apr. 24, 2007; 9 pages.
USPTO Final Rejection for U.S. Appl. No. 11/442,212 dated Jun. 7, 2011; 14 pages.
USPTO Final Rejection for U.S. Appl. No. 11/442,212 dated Oct. 2, 2009; 12 pages.
USPTO Final Rejection for U.S. Appl. No. 11/442,212 dated Oct. 13, 2010; 13 pages.
USPTO Final Rejection for U.S. Appl. No. 11/477,179 dated Apr. 1, 2010; 10 pages.
USPTO Final Rejection for U.S. Appl. No. 11/477,179 dated Nov. 24, 2010; 10 pages.
USPTO Final Rejection for U.S. Appl. No. 11/484,085 dated Mar. 16, 2010; 7 pages.
USPTO Final Rejection for U.S. Appl. No. 11/502,267 dated Feb. 3, 2009; 10 pages.
USPTO Final Rejection for U.S. Appl. No. 11/512,042 dated Dec. 21, 2010; 7 pages.
USPTO Final Rejection for U.S. Appl. No. 11/600,896 dated Sep. 30, 2010; 19 pages.
USPTO Final Rejection for U.S. Appl. No. 11/601,465 dated Mar. 6, 2009; 11 pages.

\* cited by examiner

METHODS AND CIRCUITS FOR MEASURING MUTUAL AND SELF CAPACITANCE

CROSS REFERENCE TO RELATED APPLICATIONS

This application is a continuation of U.S. application Ser. No. 13/720,861, filed Dec. 19, 2012, which is a continuation of U.S. application Ser. No. 12/395,462, filed Feb. 27, 2009, now U.S. Pat. No. 8,358,142, which claims priority to U.S. Provisional Patent Application No. 61/067,539, filed Feb. 27, 2008, all of which are incorporated by reference herein in their entirety.

TECHNICAL FIELD

The present invention relates generally to touch sensors and, more particularly, to capacitive touch sensors.

BACKGROUND

Capacitive touch sensors may be used to replace mechanical buttons, knobs and other similar mechanical user interface controls. The use of a capacitive sensor allows for the elimination of complicated mechanical switches and buttons, providing reliable operation under harsh conditions. In addition, capacitive sensors are widely used in modern customer applications, providing new user interface options in existing products.

BRIEF DESCRIPTION OF THE DRAWINGS

Embodiments are illustrated by way of example and are not intended to be limited by the figures of the accompanying drawings, in which like references indicate similar elements and in which.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

A capacitive sensor may be characterized by a base capacitance that includes a self capacitance component and a mutual capacitance component. Since the values of these capacitance components affect the operation of the capacitive touch sensor and may vary from one capacitive sensor to another, a capacitive sensing circuit may benefit from the capability of independently measuring the self and mutual capacitances of a capacitive sensor.

Apparatus for and methods of measuring mutual and self capacitance in a capacitive touch sensor are described. The apparatus and methods described herein may be used in capacitive touch detection systems such as, for example, capacitive touch screens and, in particular, with capacitive touch screens having multiple simultaneous touch detection capabilities. Alternatively, the apparatus and methods described herein may be used with single touch detection systems or other types of capacitive touch system.

Figure 1:
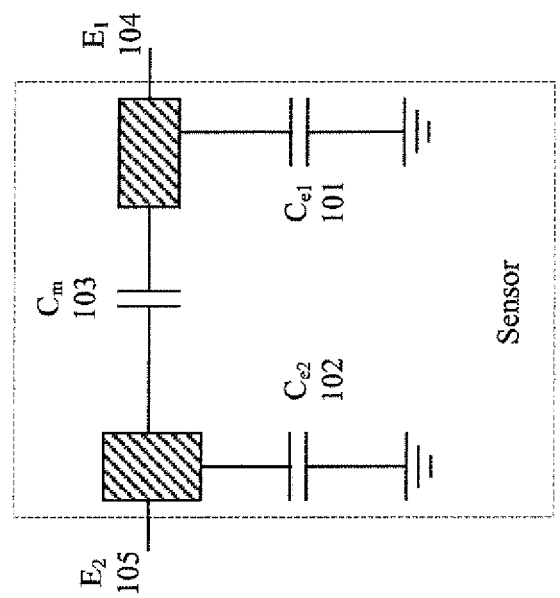
FIG. 1 illustrates alternative models of two electrodes situated close to each other, according to one embodiment.

Embodiments of the present invention allow for measurement of two or more electrodes' mutual and self capacitance separately. Capacitance measurement can be performed with a single pair of electrodes or with the use of a multiple electrode system. Alternative models of two electrodes situated close to each other are shown at FIG. 1, where $C_{e1}$ 101 and $C_{e2}$ 102 are electrode self capacitances, and $C_m$ 103 is the mutual capacitance between the two electrodes $E_1$ 104 and $E_2$ 105.

Figure 2:
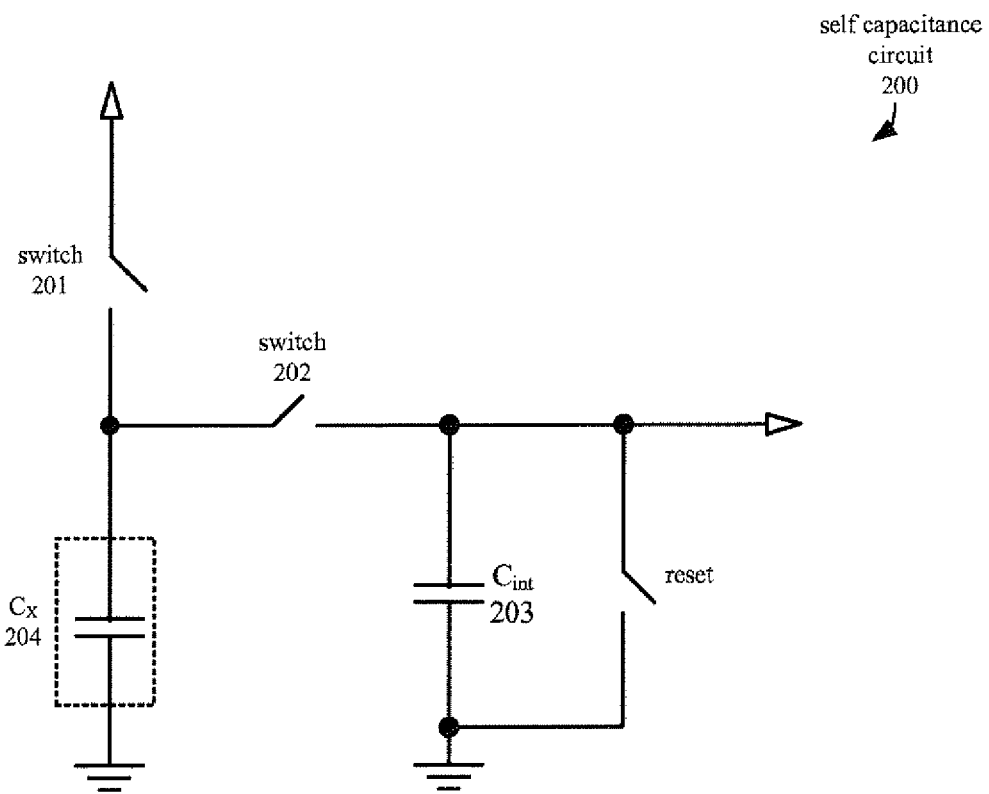
FIG. 2 illustrates one embodiment of a self-capacitance circuit that uses a charge accumulation technique.

There are various circuit implementations that may be used for performing capacitance measurement. FIG. 2 illustrates a self-capacitance circuit 200 that uses a charge accumulation technique to measure the capacitance $C_X$ 204. A charge accumulation technique operates in the following way: initially the integration capacitor is reset by turning on the reset signal for some time. After reset, the switches 201 and 202 start operation in the two non-overlapping phases. The voltage on $C_{int}$ 203 starts increasing. The sensing capacitance is determined by the number of switching cycles used to get the integrator capacitor voltage to some threshold value.

With such a charge accumulation technique, the voltage on the integration capacitance rises exponentially with respect to time (which can be measured by the cycle count). This relationship can be linearized for measurement methods where capacitance is calculated as a function of integration capacitor voltage after a predefined number of cycles. Also, the mutual capacitance measurement scheme has some sensitivity to the sensor self capacitance, which decreases the measurement accuracy.

Figure 3:
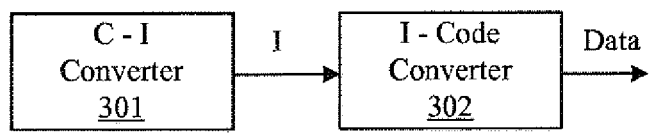
FIG. 3 illustrates a block diagram of an apparatus for measuring mutual or self capacitance, according to one embodiment.

FIG. 3 illustrates a block diagram of a capacitance measurement circuit for measuring mutual or self capacitance, according to one embodiment of the present invention. The apparatus illustrated in FIG. 3 can be used for separately measuring mutual or self sensor capacitances. In order to measure a mutual capacitance, the $C_e1$, $C_e2$ capacitance influence should be excluded. This can be accomplished by charging and discharging the $C_e2$ electrode from a low-impedance voltage source and keeping the voltage of the $C_e1$ electrode close to constant to minimize the influence of its charge-discharge current. In order to measure the self-capacitance (of $C_e1$ or $C_e2$) the voltage change across $C_m$ should be kept to zero to minimize the influence of this capacitance on the measurement results.

The capacitance measurement circuit 300 can be separated into two parts: the switching capacitor front-end capacitance to current (C-I) converter 301, and the back-end current to digital value (I-code) converter 302, as illustrated in FIG. 3. In the following description, the front-end and back-end circuits are described separately. A switching capacitor front-end converts the sensing capacitance to current pulses (C-I Converter). The back-end system averages the current and converts it into readable digital values (I-Code Converter). The circuits described herein are based on a switching capacitor technique in capacitance to current converter circuits.

Figure 4A:
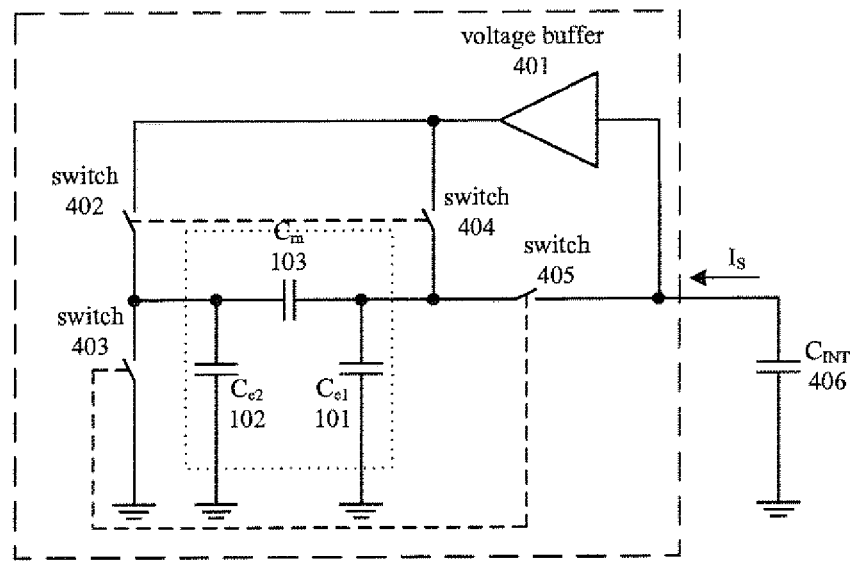
FIG. 4A illustrates one embodiment of a capacitance to current sink converter having an integration capacitor coupled to ground.
Figure 4B:
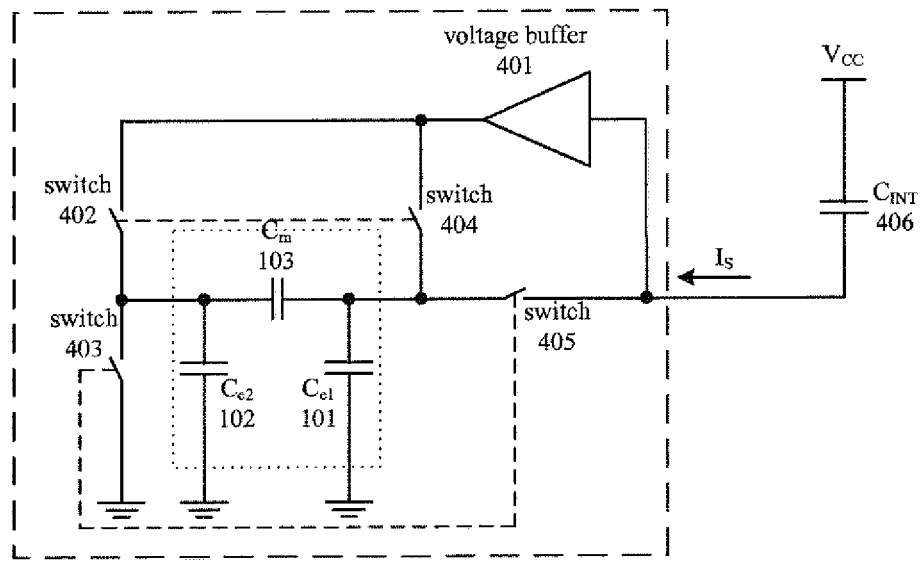
FIG. 4B illustrates one embodiment of a capacitance to current sink converter having an integration capacitor coupled to a high voltage supply potential.

FIGS. 4A, 4B, 5A and 5B show different embodiments for a capacitance to current converter (CTC or C-I Converter) for mutual capacitance measurement. In the following figures, a voltage buffer 401 resides between the integration capacitor $C_{int}$ 406 and the switches 402, 404 connecting to the mutual electrodes of the CTC. It should be noted that the integration capacitor $C_{int}$ 406 is considered as part of the current measurement system and shown here for ease of explanation. The integration capacitor 406 can be connected between the converter output and a fixed potential net, for example, GND and Vcc, as illustrated in FIGS. 4A and 4B respectively.

The operation of the circuit may be described in several stages, which are repeated in cycle. Table 1 contains the switching sequence of switches for the circuits shown in FIGS. 4A and 4B.

TABLE 1

Switching sequence of switches shown in FIGS. 4A and 4B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $U_{Cm} = 0$, $U_{Ce1} = U_{Ce2} = U_{Cint} = U_{buf}$ |
| 3 | OFF | OFF | OFF | OFF | $U_{Cm} = 0$, $U_{Ce1} = U_{Ce2} = U_{Cint}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 5A:
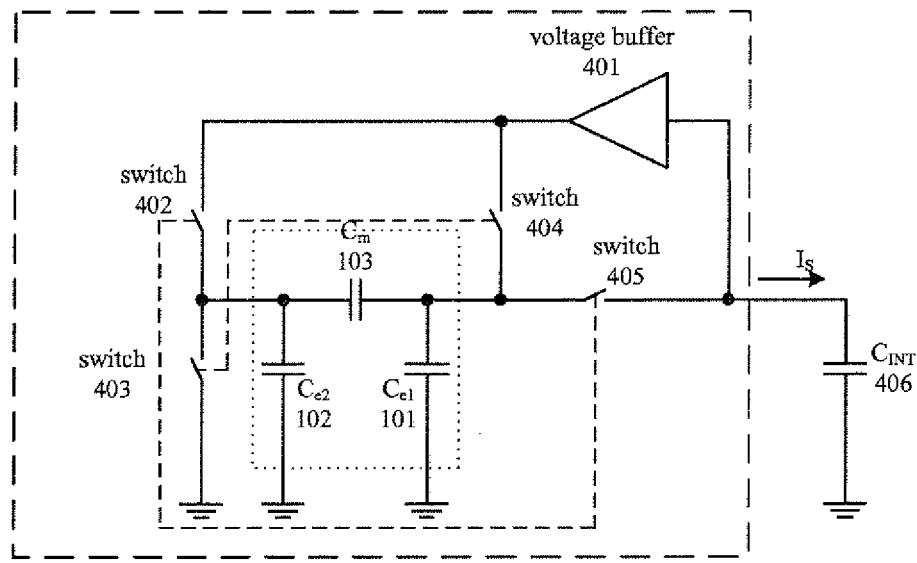
FIG. 5A illustrates one embodiment of a capacitance to current sink converter having an integration capacitor coupled to ground.
Figure 5B:
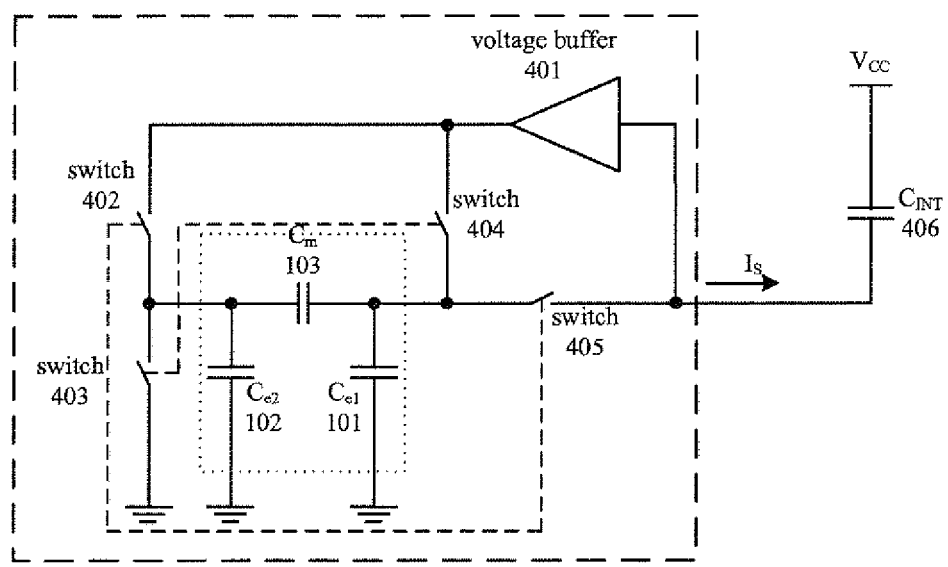
FIG. 5B illustrates one embodiment of a capacitance to current sink converter having an integration capacitor coupled to a high voltage supply potential.

Table 2 contains the switching sequence of switches for the circuits shown in FIGS. 5A and 5B.

TABLE 2

Switching sequence of switches shown in FIGS. 5A and 5B.

| Stage | Switch 402 | Switch 403 | Switch 404 | Switch 405 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $U_{Cm} = 0$, $U_{Ce1} = U_{Cint}$, $U_{Ce2} = U_{Cint}$ |
| 5 | OFF | OFF | OFF | OFF | $U_{Cm} = 0$, $U_{Ce1} = U_{Cint}$, $U_{Ce2} = U_{Cint}$ |

The stages from 2 to 5 are performed in cycles. In effect, the circuits shown in FIGS. 4A and 4B act as current sinks, and the circuits shown in FIGS. 5A and 5B act as current sources. The integration capacitor $C_{int}$ 406 is external to the CTC and is not part of the current measurement circuit.

Figure 6:
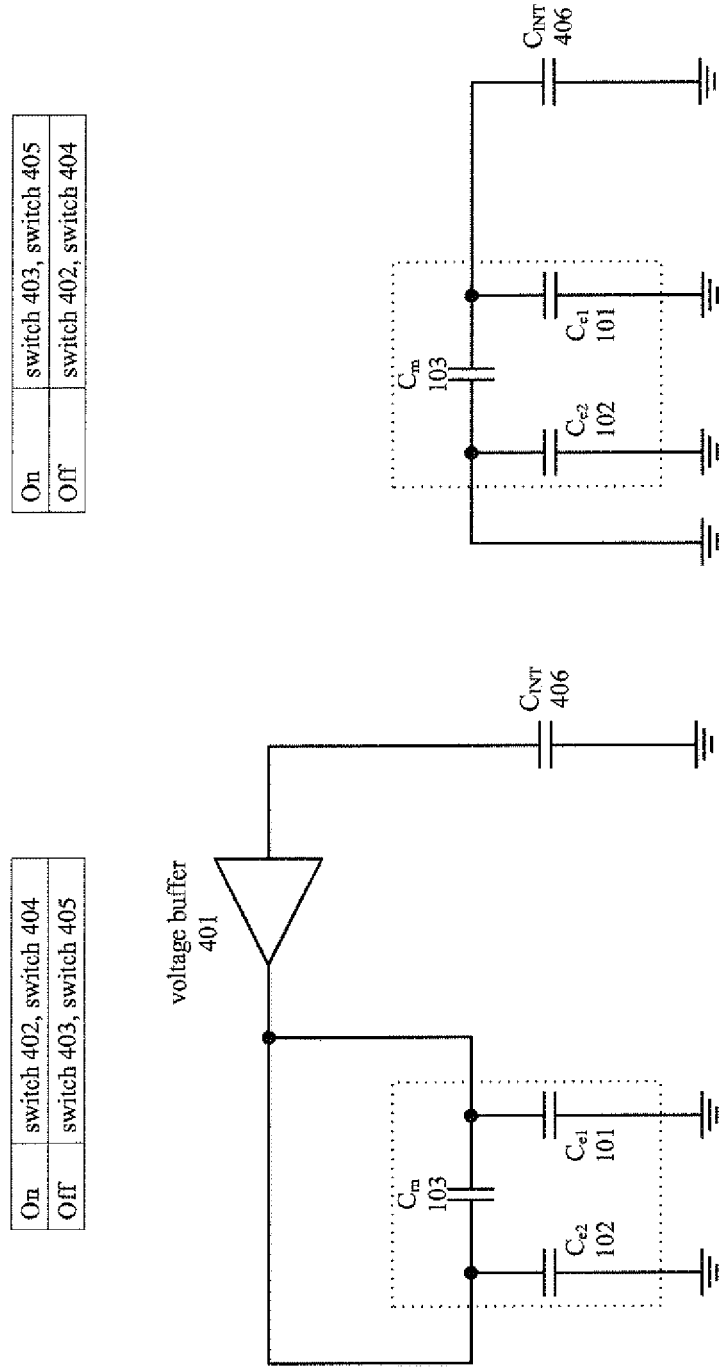
FIG. 6 illustrates phases of a converter operation, according to one embodiment.

FIG. 6 illustrates one embodiment of the operation phases for the circuits shown in FIGS. 4A and 4B. During the first phase, both ends of the $C_m$ 103 are connected to voltage buffer 401. During the second phase, the left $C_m$ terminal is grounded and the right terminal is connected to the integration capacitor $C_{int}$ 406.

For both circuits, an averaged absolute current sink/source ($I_S$) value can be calculated by Equation 1:

$$I_S = f_{sw} \cdot U_{Cint} \cdot C_m \quad (1)$$

where, $f_{sw}$ is the switching frequency of phases 2-5 repeating. It should be noted that the capacitance of $C_e1$ electrode 102 is shunted by switch 402 or 403 in each operation phase and does not have an impact on the output current. The capacitance of the $C_{e1}$ electrode 101 has a potential equal to $U_{Cint}$ during both charge transfer stages and is not recharged between different operation phases. Therefore, the output current is determined by the value of $C_m$ 103.

A special case of the current converter operation is now considered, when it is loaded by stand-alone integration capacitor $C_{int}$ 406. In this case, the relationship between the voltage change on $U_{Cint}$ and the cycles count N has a nonlinear exponential character, as expressed in Equation 2:

$$U_{Cint}^N = U_{Cint}^0 \cdot \left(1 - \frac{C_m}{C_{int}}\right)^N \quad (2)$$

$$\left(U_{Cint}^N \approx U_{Cint}^0 \cdot e^{-N\frac{C_m}{C_{int}}}\right)$$

where, N is the quantity of conversion cycles and $U_{Cint}^0$ is the voltage on the integration capacitor 406 at the initial time.

The exponential character of this dependence is caused by the positive voltage feedback via buffer 401: increasing voltage on the integration capacitor 406 causes a larger charge quantum being added in each phase and an increase in the speed of the integration capacitor 406 voltage rising. This may be considered as drawback in some applications, especially when the current measurement circuit does not keep a voltage on the integration capacitor 406 constant.

Figure 7A:
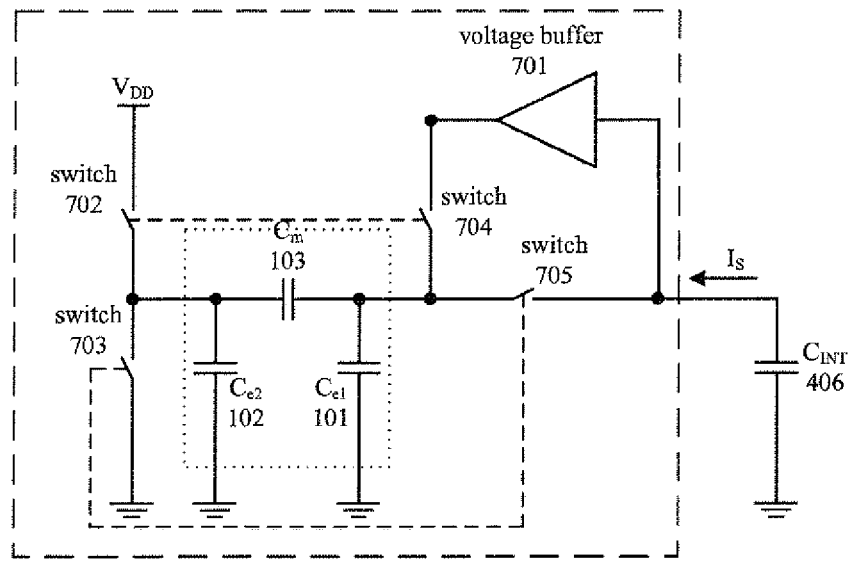
FIG. 7A illustrates one embodiment of a capacitance to current sink converter used for mutual capacitance measurement, having an integration capacitor coupled to ground.
Figure 7B:
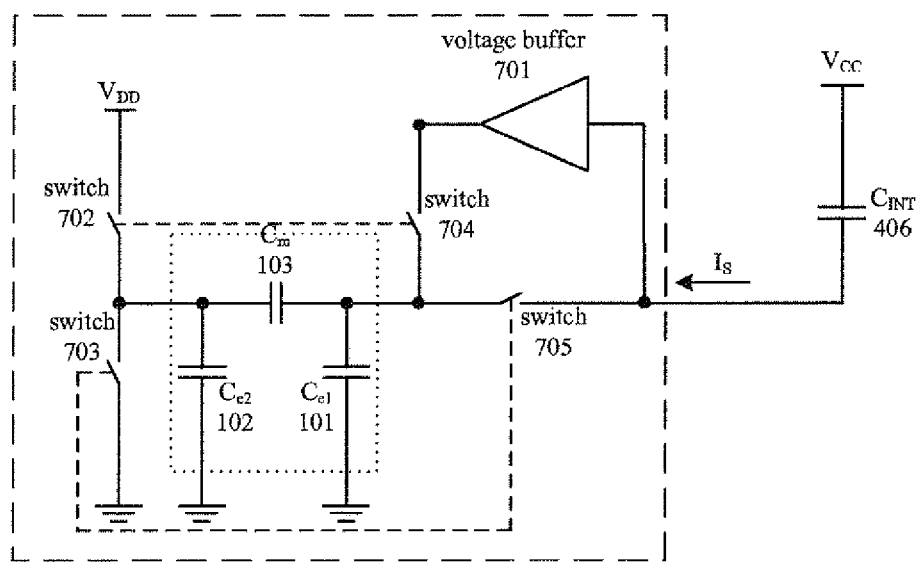
FIG. 7B illustrates one embodiment of a capacitance to current sink converter used for mutual capacitance measurement, having an integration capacitor coupled to $V_{CC}$.

To avoid this drawback, the circuit embodiments illustrated in FIGS. 7A, 7B, 8A, and 8B may be used. The difference between the circuit embodiments illustrated in FIGS. 7A, 7B, 8A, and 8B, versus those illustrated in FIGS. 4A, 4B, 5A, and 5B, is that the right terminal of $C_m$ 103 is connected to the fixed voltage source $V_{DD}$ instead of the floating buffer output voltage of the analog buffer 701. Only the switch 702 connection is changed on the circuits illustrated in FIGS. 7A, 7B, 8A, and 8B. The switching sequence of the switches illustrated in FIGS. 7A and 7B is shown in Table 3 below.

TABLE 3

Switching sequence of switches in FIGS. 7A and 7B.

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | ON | OFF | ON | OFF | $-U_{Cm} = U_{Vdd} - U_{Cint}$, $U_{Ce1} = U_{Cint} = U_{buf}$, $U_{Ce2} = U_{Vdd}$ |
| 3 | OFF | OFF | OFF | OFF | $U_{Cm} = U_{Vdd} - U_{Cint}$, $U_{Ce1} = U_{Cint}$, $U_{Ce2} = U_{Vdd}$ |
| 4 | OFF | ON | OFF | ON | $U_{Cm} = U_{Cint} = U_{Ce1}$, $U_{Ce2} = 0$ |
| 5 | OFF | OFF | OFF | OFF | $U_{Cm} = U_{Ce1}$, $U_{Ce2} = 0$ |

Figure 8A:
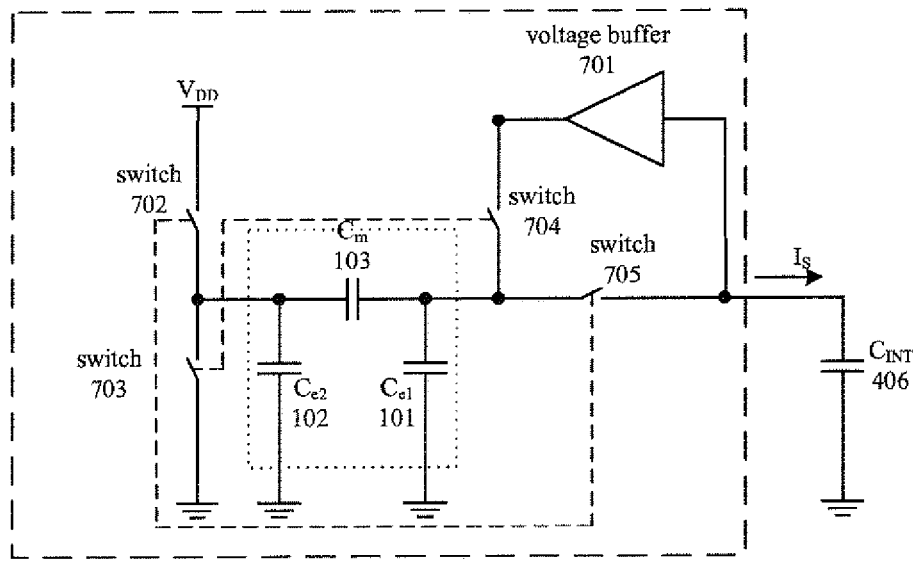
FIG. 8A illustrates one embodiment of a capacitance to current source converter having an integration capacitor coupled to ground.
Figure 8B:
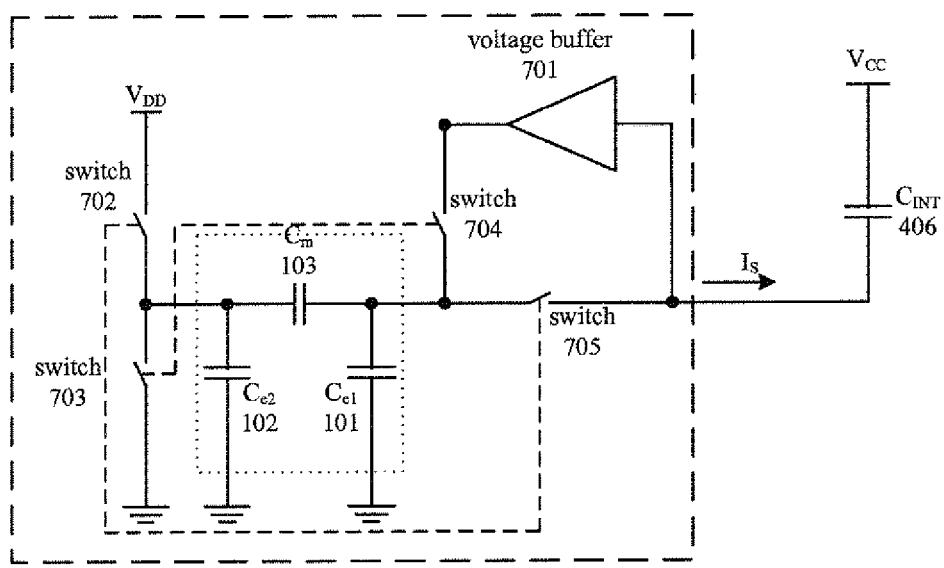
FIG. 8B illustrates one embodiment of a capacitance to current source converter having an integration capacitor coupled to a high voltage supply potential.

The switching sequence of the switches illustrated in FIGS. 8A and 8B is shown by Table 4 below.

TABLE 4

Switching sequence of switches in FIGS. 8a and 8b

| Stage | Switch 702 | Switch 703 | Switch 704 | Switch 705 | $U_{Cint}$, $U_{Ce1}$, $U_{Ce2}$, $U_{Cm}$ |
|---|---|---|---|---|---|
| 1 | OFF | OFF | OFF | OFF | $U_{Cint} = U_0$ |
| 2 | OFF | ON | ON | OFF | $U_{Cm} = U_{buf} = U_{Cint} = U_{Ce1}$ |
| 3 | OFF | OFF | OFF | OFF | $U_{Cm} = U_{Cint} = U_{Ce1}$ |
| 4 | ON | OFF | OFF | ON | $-U_{Cm} = U_{Vdd} - U_{Cint}$, $U_{Ce1} = U_{Cint}$, $U_{Ce2} = U_{Vdd}$ |
| 5 | OFF | OFF | OFF | OFF | $U_{Cm} = 0$, $U_{Ce1} = U_{Cint}$, $U_{Ce2} = U_{Vdd}$ |

The stages from 2 to 5 are performed in cycles. As a result, the average current flowing out of the $C_{int}$ 406 capacitor for the circuits on FIGS. 7A, 7B, 8A, and 8B can be calculated by Equation 3:

$$I_S = f_{sw} \cdot U_{vdd} \cdot C_m \quad (3)$$

For the given values of $f_{sw}$ and $V_{DD}$ parameters, the output current ($I_S$) linearly depends only on $C_m$ and is proportional to $f_{sw}$ and $V_{DD}$. The change of current direction is done by a change of the switches' operation phases. If the current measurement subsystem does not load the integration capacitor $C_{int}$ 406, a voltage on this capacitor changes linearly with the number of cycles N, as expressed in Equation 4:

$$U_{Cint}^N = U_{Vdd} \cdot \left(1 - N \cdot \frac{C_m}{C_{int}}\right) \quad (4)$$

A similar Equation 5 is used for describing the circuits illustrated in FIGS. 8A and 8B:

$$U_N = N \cdot U_{Vdd} \cdot \frac{C_m}{C_{int}} \quad (5)$$

The circuit embodiments described above may be used for self-capacitance measurement with minimal hardware changes by routing the buffer signal to the right side switches. To do this, the switches voltages may be adjusted in such way that the voltage change on the mutual capacitance $C_m$ is equal to zero between different phases. In other circuit configurations, the voltage on $C_e2$ is kept constant but the voltage on $C_m$ is varied. In the circuit embodiments illustrated in FIGS. 7A, 7B, 8A, and 8B, the voltage on $C_e2$ is varied and the voltage on $C_m$ is kept constant.

Figure 9A:
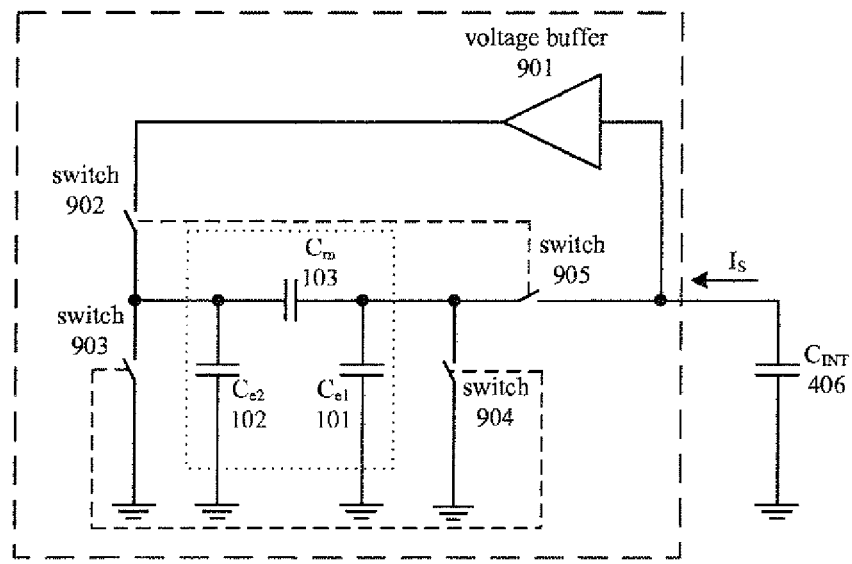
FIG. 9A illustrates one embodiment of a capacitance to current sink converter used for self capacitance measurement, having an integration capacitor coupled to ground.
Figure 9B:
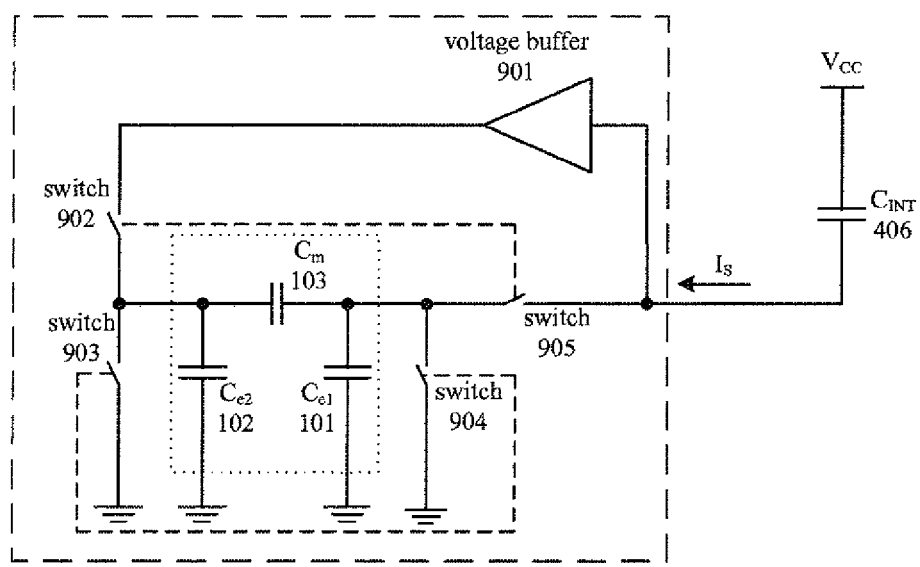
FIG. 9B illustrates one embodiment of a capacitance to current sink converter used for self capacitance measurement, having an integration capacitor coupled to a high voltage supply potential.

FIGS. 9A and 9B illustrate embodiments of a capacitance to current sink converter for self capacitance measurement. As previously noted, the integration capacitor $C_{int}$ 406 is considered part of the current measurement system and is shown here for ease of explanation. The integration capacitor 406 can be connected between the converter output and any fixed potential net, for example, GND and $V_{CC}$, as illustrated in FIGS. 9A and 9B respectively. Alternatively, the integration capacitor 406 can be connected between the converter output and other fixed potentials. The switching sequence of switches illustrated in the circuit of FIGS. 9A and 9B is shown in Table 5 below.

TABLE 5

Switching sequence of switches illustrated in FIGS. 9A, 9B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | OFF | ON | ON | OFF | $U_{Ce1} = U_{Ce2} = 0, U_{Cm} = 0$ |
| 3 | OFF | OFF | OFF | OFF | $U_{Ce1} = U_{Ce2} = 0, U_{Cm} = 0$ |
| 4 | ON | OFF | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Figure 10A:
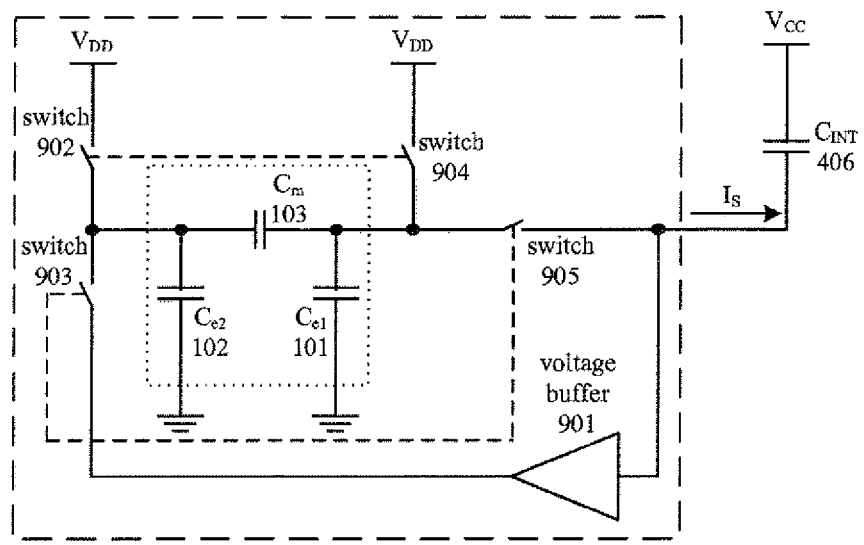
FIG. 10A illustrates one embodiment of a capacitance to current source converter used for self capacitance measurement, having an integration capacitor coupled to ground.
Figure 10B:
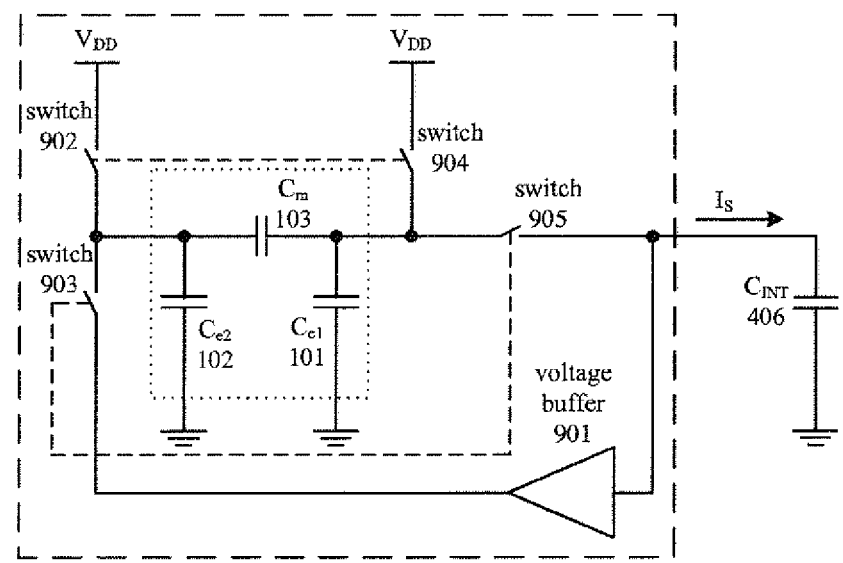
FIG. 10B illustrates one embodiment of a capacitance to current source converter used for self capacitance measurement, having an integration capacitor coupled to a high voltage supply potential.

The switching sequence of switches in FIGS. 10A and 10B is shown in Table 6 below.

TABLE 6

Switching sequence of switches illustrated in FIGS. 10A, 10B.

| Stage | Switch 902 | Switch 903 | Switch 904 | Switch 905 | $U_{Cint}, U_{Ce1}, U_{Ce2}, U_{Cm}$ |
|---|---|---|---|---|---|
| 1 | OFF | OFF | OFF | OFF | $U_{Cint} = U_0$ |
| 2 | ON | OFF | ON | OFF | $U_{Ce1} = U_{Ce2} = U_{Vdd}$, $U_{Cm} = 0$ |
| 3 | OFF | OFF | OFF | OFF | $U_{Ce1} = U_{Ce2} = U_{Vdd}$, $U_{Cm} = 0$ |
| 4 | OFF | ON | OFF | ON | $U_{e1} = U_{Cint} = U_{Ce2}$, $U_{Cm} = 0$ |
| 5 | OFF | OFF | OFF | OFF | $U_{e1} = U_{Cint} = U_{Ce2}$, $U_{Cm} = 0$ |

Stages 2 through 5 are performed in cycles. As a result, the average current flowing into capacitor $C_{int}$ for the circuits illustrated in FIGS. 9A and 9B is described by Equation 6 below:

$$I_S = f_{sw} \cdot U_{Cint} \cdot C_{e1} \qquad (6)$$

The average current flowing out of $C_{int}$ capacitor for the circuits illustrated in FIGS. 10A and 10B are described by Equation 7:

$$I_S = f_{sw} \cdot (U_{vdd} - U_{Cint}) \cdot C_{e1} \qquad (7)$$

The potential difference on electrode capacitor $C_m$ 103 is equal to approximately zero during the stages of charge transfer and does not have an impact on the measurement. The $C_e2$ electrode 102 capacitance is switched off by switches 902 and 904 during the stages of operation. In this case, the relationship between the voltage change on $U_{Cint}$ and the cycle count N has a nonlinear exponential character for the circuits illustrated in FIGS. 9A and 9B, in accord with Equation 8 below:

$$U_{Cint}^N = U_{Cint}^0 \cdot \left(1 - \frac{C_{e1}}{C_{int}}\right)^N \qquad (8)$$

Equation 9 below similarly describes the circuits illustrated in FIGS. 10A and 10B:

$$U_{Cint}^N = U_{Vdd} \cdot \left(1 - e^{-N \frac{C_{e1}}{C_{int}}}\right) \qquad (9)$$

Various alternative variants of the conversion circuits described above may be used, including, for example:

Time measurement of the integration capacitor voltage threshold crossing;

Current integration using current integrator on the operational amplifier;

Converting current-to-voltage the operational amplifier and measuring the voltage using the ADC; and Sigma-delta modulator circuits.

Figure 11:
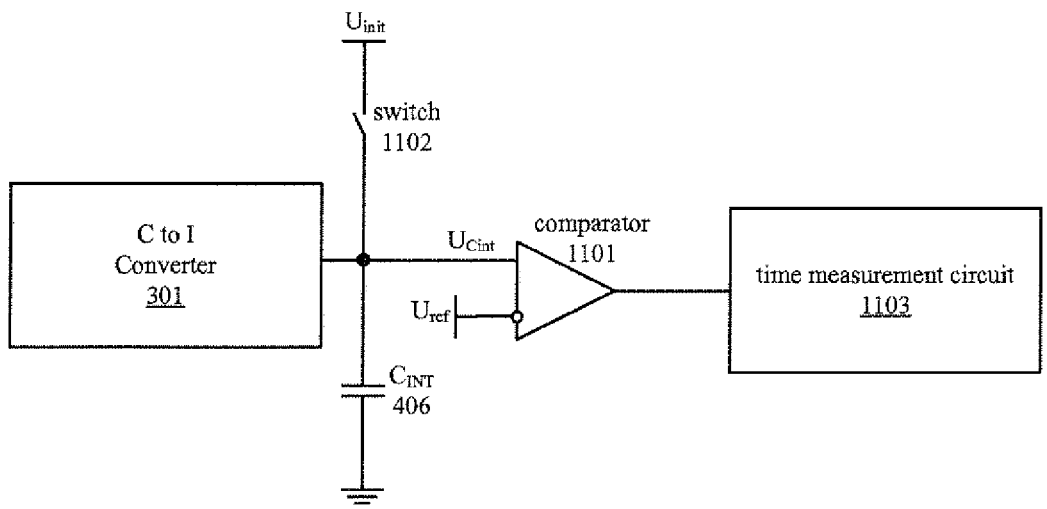
FIG. 11 illustrates one embodiment of an interval timer method for capacitance measurement.

FIG. 11 illustrates an interval timer method for capacitance measurement. In the circuit of FIG. 11, the integrator consists of a capacitor 406. The circuit of FIG. 11 operates in the following way. Initially, the voltage of integration capacitor 406 is set to $U_{init}$ by turning on, for some time period, a switch 1102. The comparator 1101 is used as threshold circuit and compares the voltage on the integration capacitor 406 with a reference voltage $U_{ref}$. The capacitance is measured by the time measurement circuit 1103 as the time elapsed (in the cycles count) until the comparator 1101 is triggered. The time is inversely proportional to the converter current. It should be noted that for switching capacitor current sink schemes, an integrator initial voltage ($U_{init}$) is set higher than the threshold voltage ($U_{ref}$). For the current source schemes, the integrator initial voltage is lower than threshold voltage $U_{ref}$.

Figure 12:
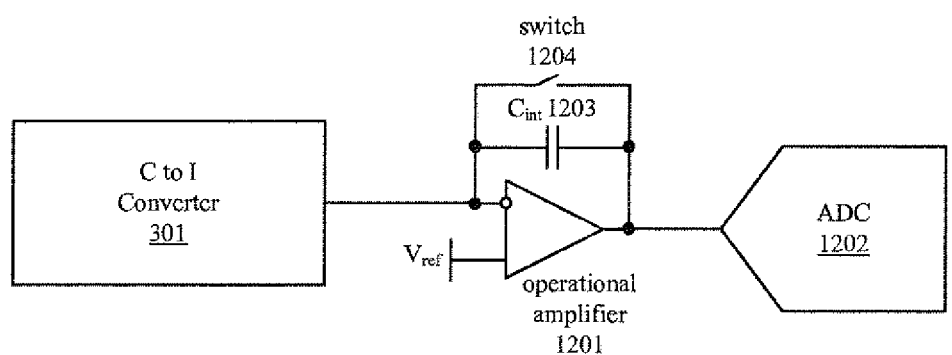
FIG. 12 illustrates one embodiment of a resettable current integrator with an operation amplifier and an analog-to-digital converter (ADC)

For more accurate current conversion, circuits based on current-to-voltage converters and current integrators may be used, as illustrated in the following figures. FIG. 12 illustrates one embodiment of a resettable current integrator (where integration capacitor 1203 can be reset using switch 1204) with an operational amplifier 1201 and an analog-to-digital converter (ADC) 1202. The ADC 1202 is used for integrator voltage measurement after the completion of a predefined number of integration cycles.

Figure 13:
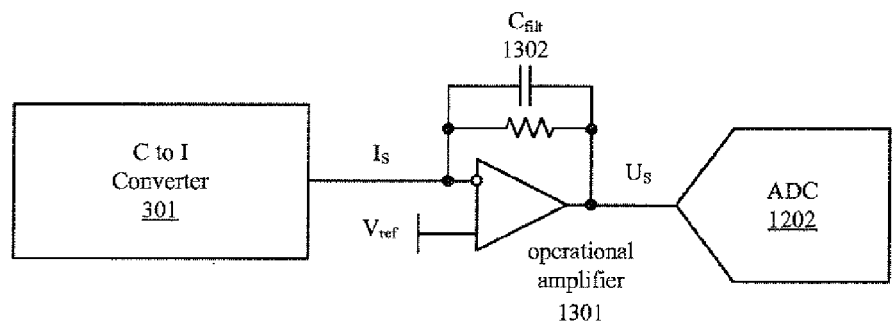
FIG. 13 illustrates one embodiment of a current-to-voltage converter built around an operational amplifier.
Figure 14:
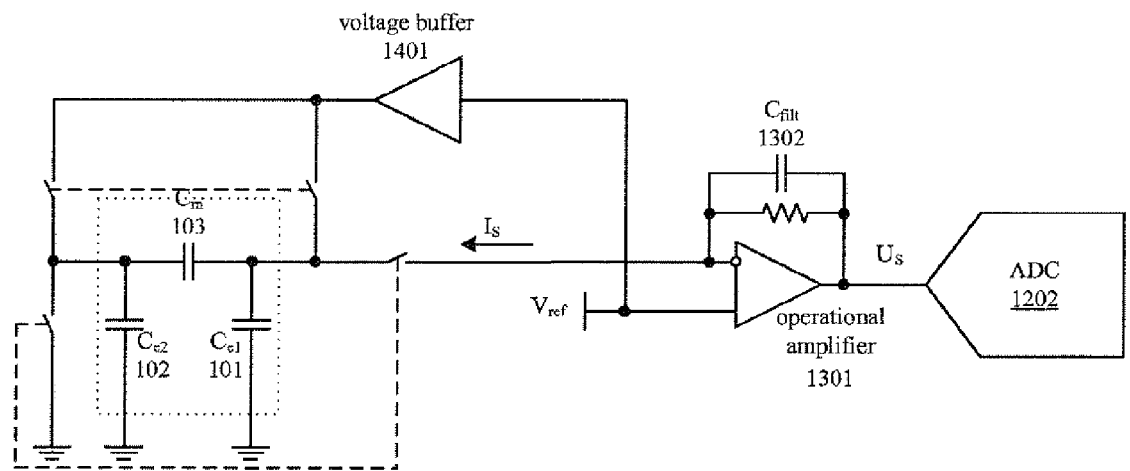
FIG. 14 illustrates one embodiment of a capacitance to current converter with a conversion circuit.

FIG. 13 illustrates one embodiment of a current-to-voltage converter built around an operational amplifier 1301. The converter of FIG. 13 also functions as a low pass filter (LPF) due to the presence of the filter capacitor $C_{filt}$ 1302 in the amplified feedback path. The output voltage $U_S$ is proportional to the input current $I_S$. The circuit of FIG. 13 operates continuously such that ADC conversion can be started any time after transient signals have stabilized. It should be noted that the buffer input inside the capacitance to code converter can be connected to the $V_{ref}$ net for the circuits illustrated in FIGS. 12 and 13, taking into account that both operational amplifier inputs have approximately the same potential. The schematic diagram of such a circuit configuration is illustrated in FIG. 14, where the input of voltage buffer 1401 is connected to the $V_{ref}$ net.

Figure 15:
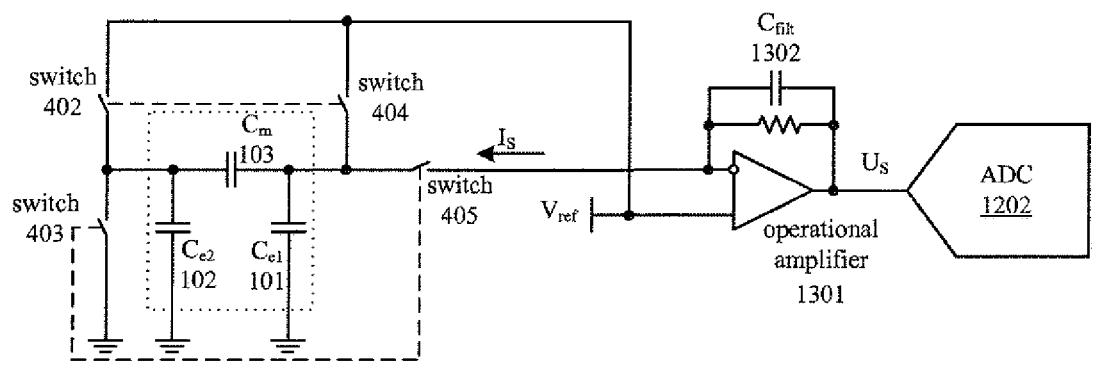
FIG. 15 illustrates one embodiment of a capacitance to current converter with a low pass filter.

In an alternative embodiment, when the $V_{ref}$ voltage source has an acceptable low output resistance, then the voltage buffer 1401 may be eliminated from the circuits illustrated herein. As an example, the circuit from FIG. 4 composed of the measurement circuit of FIG. 13 is illustrated in FIG. 15. Accordingly, FIG. 15 is an exemplary illustration of a capacitance to current converter with a low pass filter that can be implemented without a voltage buffer 1401 coupled to the reference voltage source $V_{ref}$. In one embodiment, the reference voltage $V_{ref}$ used to supply the switches in the capacitance to current converter is selected to be as close to $V_{dd}$ as possible (limited by the working range of the operational amplifier 1301), to minimize the current flow out of $C_e2$ 102 relative to the current flowing through $C_m$ 103. In alternative embodiments, the switches in the converters can be supplied with other known voltages such as, for example, $V_{dd}$.

Figure 16:
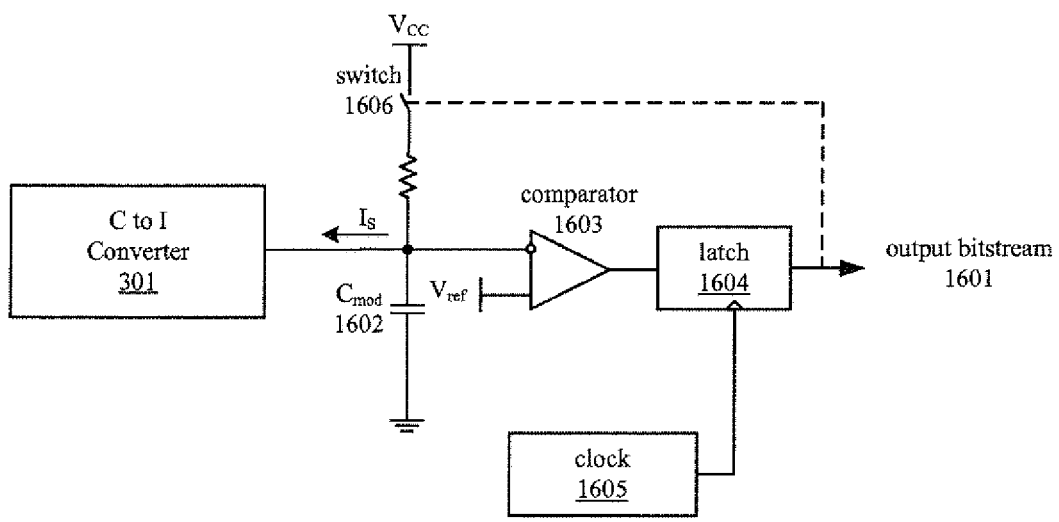
FIG. 16 illustrates one embodiment of a sigma-delta modulator configured as a capacitance to duty cycle converter.

The sigma-delta modulator circuits can be effectively used for the current to code conversion. An advantage of the sigma-delta modulator circuits is their integrative nature. FIG. 16 illustrates one possible example of a modulator implementation for a first order modulator. It should be noted that higher order modulator circuits can be used as well. The sigma-delta modulator of FIG. 16 converts the current $I_S$ to a code in output bitstream 1601. The current $I_S$ discharges modulation capacitor $C_{mod}$ 1602 until the voltage at $C_{mod}$ 1602 falls below $V_{ref}$, at which point comparator 1603 asserts its output to latch 1604, which outputs bits synchronously with a clock signal provided by clock 1605. The latch 1604 then closes switch 1606 to recharge $C_{mod}$ 1602 for the next measurement cycle.

Figure 17:
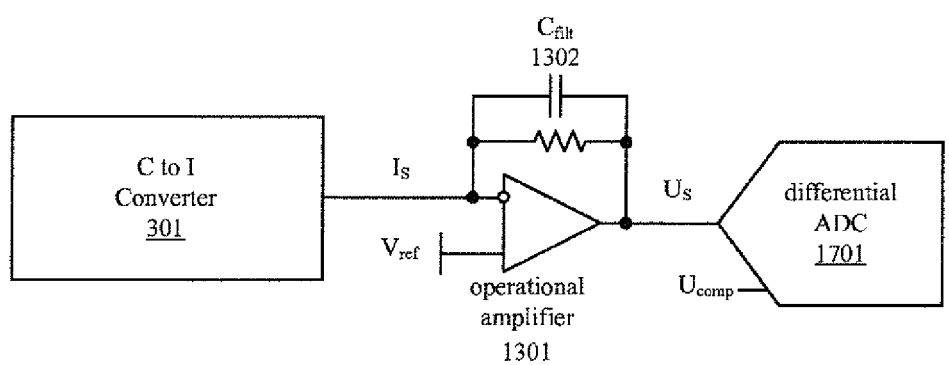
FIG. 17 illustrates one embodiment of a low pass filter with a differential analog to digital converter.

In one embodiment, the capacitance measurement circuit embodiments described above may be used in touch sensitive devices. With such devices, a small capacitance change should be detected over the presence of large base capacitance. Such sensors have two components of capacitance, described in Equation 10 below:

$$C_S = C_{Sconst} + C_{Stouch} \quad (10)$$

where, $C_{Sconst}$ is the capacitance of sensor when touch is absent, and $C_{Stouch}$ is the additional capacitance caused by an input, such as a finger touch. The informative part of the sensor capacitance $C_S$ is the $C_{Stouch}$ component. In order to increase the resolution of the sensor, the particular compensation of the current generated by the $C_{Sconst}$ capacitance can be used. There are several possible implementations of this technique. In one embodiment, an ADC 1701 with differential inputs may be used as illustrated in FIG. 17. In the circuit of FIG. 17, the $U_{comp}$ voltage is supplied to the second input of ADC 1701.

Figure 18A:
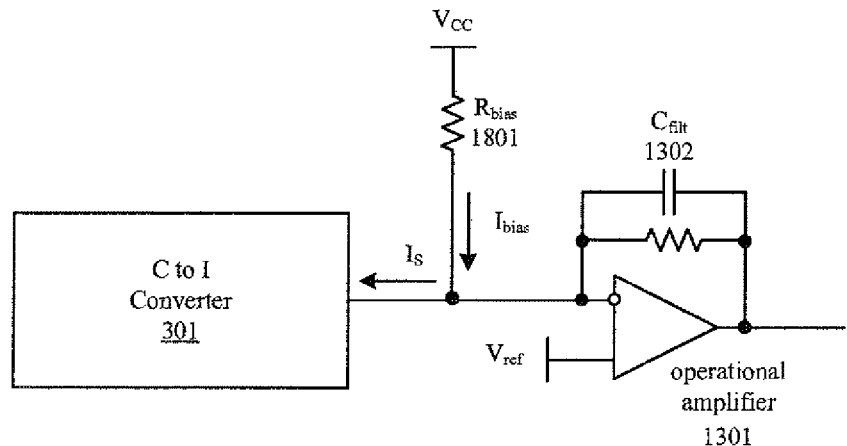
FIG. 18A illustrates base capacitance current compensation using a resistor as a current sink in a capacitance to current converter, according to one embodiment.
Figure 18B:
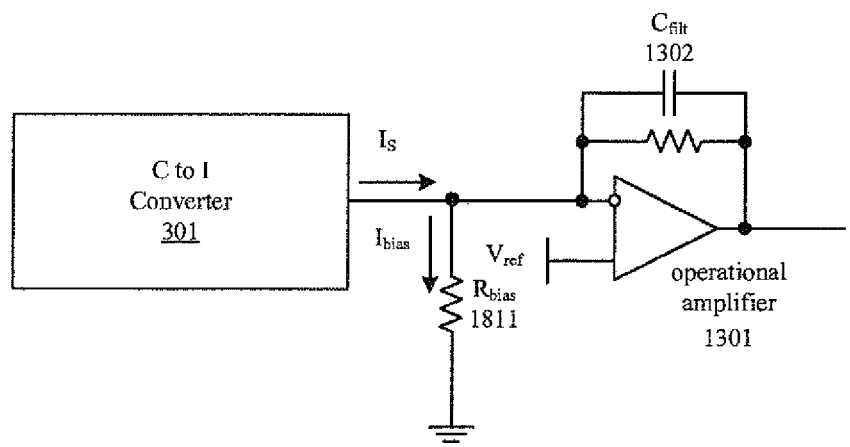
FIG. 18B illustrates base capacitance current compensation using a resistor for a current source in a capacitance to current converter, according to one embodiment.
Figure 19A:
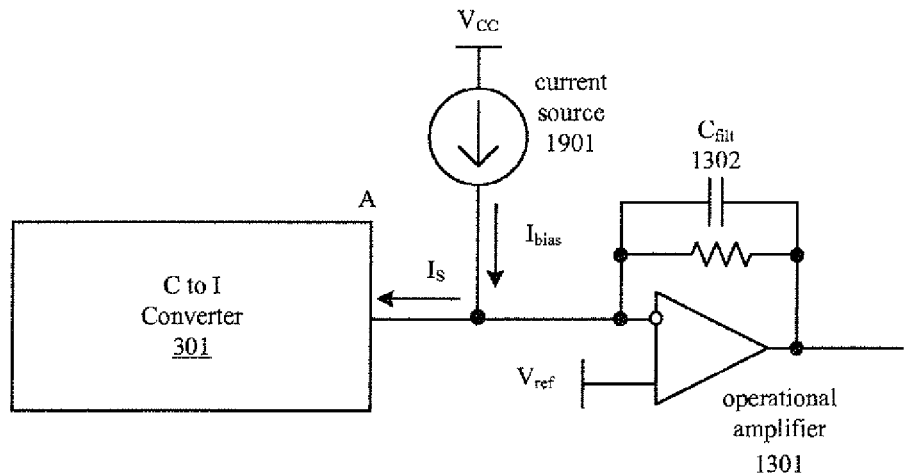
FIG. 19A illustrates base capacitance current compensation using a current source as a current sink in a capacitance to current converter, according to one embodiment.
Figure 19B:
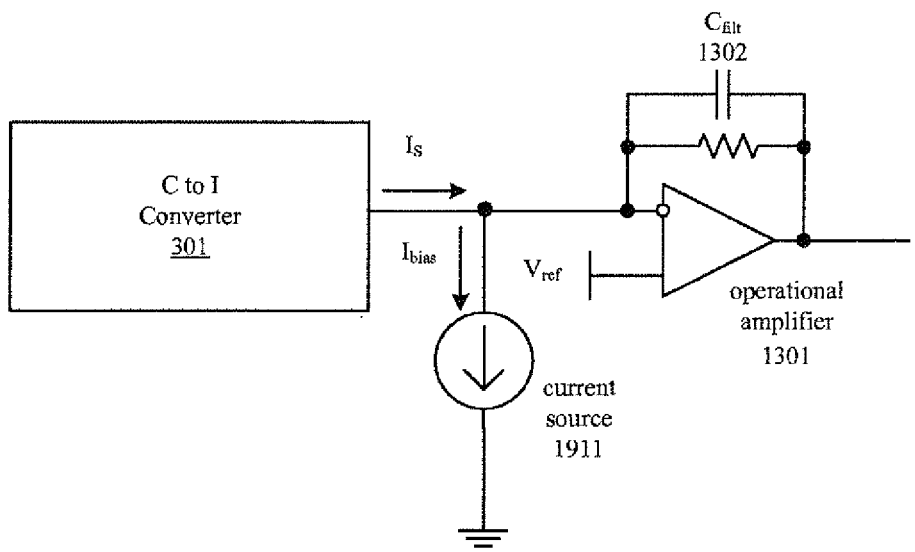
FIG. 19B illustrates base capacitance current compensation using a current source in a capacitance to current converter, according to one embodiment.

Alternative embodiments provide base capacitance current compensation using a programmable current source or a resistor, as illustrated in FIGS. 18A, 18B, 19A, and 19B. More specifically, FIG. 18A illustrates base capacitance current compensation using a resistor $R_{bias}$ 1801 as a current source in a capacitance to current converter, according to one embodiment. FIG. 18B illustrates base capacitance current compensation using a resistor $R_{bias}$ 1811 as a current sink in a capacitance to current converter, according to one embodiment. FIG. 19A illustrates base capacitance current compensation using a current source 1901 as a current sink in a capacitance to current converter, according to one embodiment. FIG. 19B illustrates base capacitance current compensation using a current source 1911 in a capacitance to current converter, according to one embodiment.

The capacitance measurement circuits described herein may be used for touch detection in single electrode systems, transmit/receive (TX-RX) systems, or in combined TX-RX and single electrode systems. The TX-RX systems can use the mutual capacitance change detection, and single electrode systems can use the self capacitance change detection. In some embodiments, additional multiplexers can be added for multiple electrode scanning. The capacitance measurement circuits described herein may be used in various applications including, for example, single button applications, multiple buttons applications, linear and radial sliders, dual dimension touchpads, and multi-touchpad applications. Multi-touchpad systems are composed of a matrix of RX and TX electrodes, where the presence (e.g., touch) of a finger (or other conductive object) is detected as a decrease in the mutual capacitance at the intersection of the TX-RX electrodes.

Figure 20A:
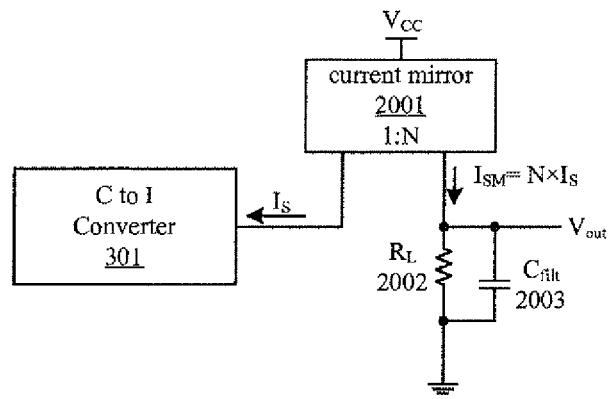
FIG. 20A illustrates using a current mirror with a voltage conversion system, according to one embodiment.
Figure 20B:
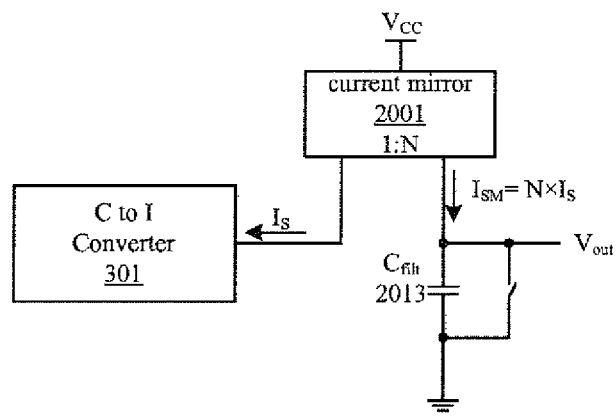
FIG. 20B illustrates using a current mirror with a current conversion system, according to one embodiment.
Figure 20C:
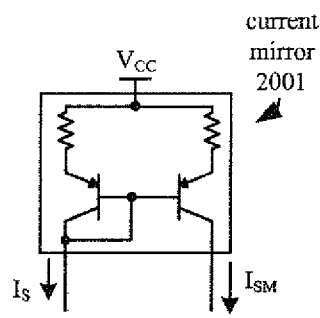
FIG. 20C illustrates one embodiment of a current mirror using a bipolar process technology.

FIGS. 20A, 20B, and 20C illustrate using a current mirror in the conversion circuits. FIG. 20A shows an example of a circuit for current-to-voltage conversion using a low-pass filter, formed by the combination of load resistance $R_L$ 2002 and filter capacitor $C_{filt}$ 2003. A filter output voltage can be measured using an ADC. FIG. 20B illustrates a current-to-current conversion circuit. A current is sourced to the filter capacitor $C_{filt}$ 2013. The different circuits can be used for integration capacitor current measurement. In one embodiment, a current can be measured using a threshold comparator and a timer (not shown). In another embodiment, a filter capacitor voltage is measured using an ADC after running operation within a predefined amount of time. The current mirror has low input impedance, which allows keeping a current mirror input pin voltage close to a constant voltage (e.g. $V_{CC}$). This improves the operating conditions of the capacitance to current conversion circuit, allowing the use of a voltage buffer with a smaller slew rate and reduced current consumption. Also, the current mirror serves as a current amplifier, boosting the converter current by a multiple N. Many implementations of the current mirror circuit are possible, and one implementation is shown at FIG. 20C.

Figure 21:
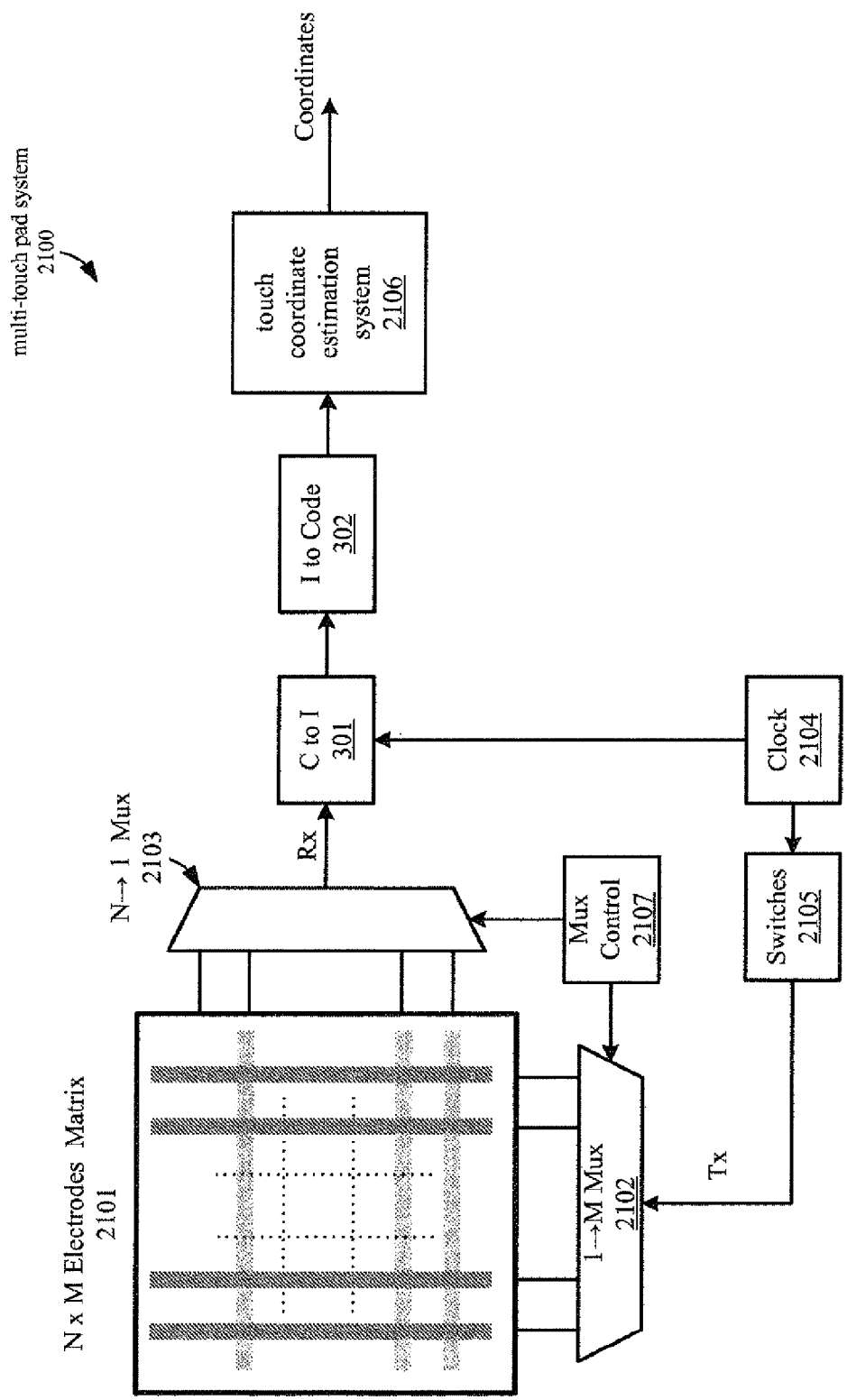
FIG. 21 illustrates one embodiment of a capacitance measurement circuit in a multi-touch touchpad system.

FIG. 21 illustrates a simplified schematic of a multi-touch pad system. The multi-touch pad system 2100 is composed of a dual dimension array (matrix) of electrodes 2101, column and row signal multiplexers 2102 and 2103, multiplexor control 2107, clock source 2104, drive switches 2105, capacitance to current converter 301, current to code converter 302, and touch coordinate estimation system 2106. The electrodes matrix can be fabricated from any conductive material, as copper, conductive ink, Indium Thin Oxide, PEDOT, etc.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

The invention claimed is:

1. An apparatus comprising:
   a sensing device coupled to a capacitive sense array including a plurality of capacitive sensors, wherein each capacitive sensor of the capacitive sense array includes a respective self capacitance component and a respective mutual capacitance component, and the sensing device further comprises:
   self-capacitance circuitry electrically coupled to the respective self capacitance component of each capacitive sensor and configured to perform self-capacitance sensing operations to measure self capacitance of the respective capacitive sensor; and
   mutual-capacitance circuitry electrically coupled to the respective mutual capacitance component of each capacitive sensor and configured to perform mutual capacitance sensing operations to measure mutual capacitance associated with the respective capacitive sensor;
   wherein both the self-capacitance circuitry and the mutual-capacitance circuitry are coupled to each capacitive sensor by a respective single pair of electrodes associated with the respective capacitive sensor, and configured to detect whether an object is proximate to a touch screen by measuring the self and mutual capacitances of the respective capacitive sensor independently and simultaneously.

2. The apparatus of claim 1, further comprising a capacitive sensor coupled to the sensing device, the capacitive sensor including a first electrode and a second electrode, wherein the first electrode is configured to have a first self-capacitance and the second electrode is configured to have a second self-capacitance, and wherein the first electrode and the second electrode are configured to have mutual capacitance between them.

3. The apparatus of claim 2 wherein, during the self-capacitance sensing operations, the sensing device is configured to measure the first self-capacitance of the first electrode.

4. The apparatus of claim 3, wherein the sensing device further comprises an integration capacitor coupled to the first electrode, wherein the integration capacitor is used to measure the first self-capacitance of the first electrode.

5. The apparatus of claim 2, wherein, during the mutual-capacitance sensing operations, the sensing device is configured to measure the mutual capacitance between the first electrode and the second electrode.

6. The apparatus of claim 1, wherein the sensing device is configured to independently measure self-capacitance values using the self-capacitance circuitry and mutual capacitance values using the mutual-capacitance circuitry.

7. The apparatus of claim 1, wherein the sensing device further comprises a switching system that is configured to selectively switch to the self-capacitance circuitry during the self-capacitance sensing operations and to the mutual-capacitance circuitry during the mutual-capacitance sensing operations.

8. The apparatus of claim 1, wherein the sensing device further comprises a measurement circuit that is coupled to the self-capacitance circuitry and the mutual capacitance circuitry, wherein the measurement circuit is configured to measure self-capacitance values during the self-capacitance sensing operations and to measure mutual capacitance values during the mutual-capacitance sensing operations.

9. A method comprising:
at a sensing device coupled to a capacitive sense array including a plurality of capacitive sensors, wherein each capacitive sensor of the capacitive sense array includes a respective self capacitance component and a respective mutual capacitance component, and the sensing device includes a self-capacitance circuit and a mutual-capacitance circuit:
for each capacitive sensor:
coupling the self-capacitance circuitry to the respective self capacitance component of the respective capacitive sensor via a respective single pair of electrodes associated with the respective capacitive sensor, wherein the self-capacitance circuitry is configured to perform self-capacitance sensing operations to measure self capacitance of the respective capacitive sensor;
coupling the mutual-capacitance circuitry to the respective mutual capacitance component of the respective capacitive sensor via the respective single pair of electrodes associated with the respective capacitive sensor, wherein the mutual-capacitance circuitry is configured to perform mutual capacitance sensing operations to measure mutual capacitance associated with the respective capacitive sensor;
selecting a type of capacitance sensing operation to perform with the self-capacitance circuitry and the mutual-capacitance circuitry; and
in accordance with the selected type of capacitance sensing operation, measuring the self capacitance and the mutual capacitance of the respective capacitive sensor independently and simultaneously.

10. The method of claim 9, wherein the capacitance value corresponds to whether an object is proximate to a touch screen.

11. A system comprising:
a capacitive sense array including a plurality of capacitive sensors, each capacitive sensor including a respective first electrode and a respective second electrode, wherein the first electrode is configured to have a first self-capacitance and the second electrode is configured to have a second self-capacitance, and wherein the first electrode and the second electrode are configured to have mutual capacitance between them;
a sensing device coupled to the capacitive sensor array, wherein the sensing device is coupled to each capacitive sensor by a respective single pair of electrodes associated with the respective capacitive sensor, and configured, for each capacitive sensor of the capacitive sensor array, to:
independently and simultaneously measure the first self-capacitance from the respective capacitive sensor during self-capacitance sensing operations and measure the mutual capacitance from the respective capacitive sensor during mutual-capacitance sensing operations.

12. The system of claim 11, wherein the sensing device comprises self-capacitance circuitry and mutual-capacitance circuitry, each configured to detect whether an object is proximate to the capacitive sensor, wherein the sensing device is further configured to: perform the self-capacitance sensing operations using the self-capacitance circuitry; and perform the mutual-capacitance sensing operations using the mutual-capacitance circuitry.

13. The system of claim 12, wherein the sensing device further comprises a measurement circuit that is coupled to the self-capacitance circuitry and the mutual-capacitance circuitry, wherein the measurement circuit is configured to measure self-capacitance values during the self-capacitance sensing operations and to measure mutual capacitance values during the mutual-capacitance sensing operations.

14. The system of claim 12, wherein the sensing device further comprises:
a voltage source configured to output a voltage for use during the self-capacitance sensing operations and the mutual-capacitance sensing operations; and
a switching system configured to selectively couple the voltage to the self-capacitance circuitry or the mutual-capacitance circuitry.

15. The system of claim 11, wherein a first capacitance value measured during the self-capacitance sensing operations corresponds to the first self-capacitance of the first electrode, and wherein a second capacitance value measured during the mutual-capacitance sensing operations corresponds to the mutual-capacitance between the first electrode and the second electrode.

16. The system of claim 11, wherein the sensing device further comprises an integration capacitor coupled to the first electrode, wherein the integration capacitor is used to measure the first self-capacitance of the first electrode.

* * * * *